US010818714B2

(12) United States Patent
Yang

(10) Patent No.: US 10,818,714 B2
(45) Date of Patent: Oct. 27, 2020

(54) IMAGE SENSOR INCLUDING A PHASE DIFFERENCE DETECTION PIXEL HAVING A LINING LAYER

(71) Applicant: SK hynix Inc., Gyeonggi-do (KR)

(72) Inventor: Yun-Hui Yang, Chungcheongbuk-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/219,571

(22) Filed: Dec. 13, 2018

(65) Prior Publication Data
US 2019/0296069 A1    Sep. 26, 2019

(30) Foreign Application Priority Data

Mar. 26, 2018    (KR) .................. 10-2018-0034371

(51) Int. Cl.
*H01L 27/146*    (2006.01)
*H04N 5/374*    (2011.01)

(52) U.S. Cl.
CPC .. *H01L 27/14623* (2013.01); *H01L 27/14603* (2013.01); *H01L 27/14621* (2013.01); *H01L 27/14627* (2013.01); *H01L 27/14645* (2013.01); *H04N 5/374* (2013.01)

(58) Field of Classification Search
CPC ............. H01L 27/14623; H01L 27/146; H01L 27/14603; H01L 27/14621; H01L 27/14627; H01L 27/14645; H01L 27/14
See application file for complete search history.

(56) References Cited

U.S. PATENT DOCUMENTS

| 8,669,134 | B2 | 3/2014 | Ito et al. | |
| 2006/0054946 | A1* | 3/2006 | Baek | ................. H01L 27/14627 257/292 |
| 2016/0198083 | A1 | 7/2016 | Kitano | |
| 2016/0276396 | A1 | 9/2016 | Tayanaka et al. | |
| 2017/0110501 | A1* | 4/2017 | Hsu | ................... H01L 27/14645 |

* cited by examiner

*Primary Examiner* — Fazli Erdem
(74) *Attorney, Agent, or Firm* — Perkins Coie LLP

(57) ABSTRACT

An image sensor may include an antireflection layer formed over a substrate, grid patterns and a guide pattern that are disposed over the antireflection layer, a color filter between the grid patterns, a phase difference detection filter structured to include a portion between one of the grid patterns and the guide pattern, and a lining layer formed to include a portion between one of the grid patterns and the phase difference detection filter. The lining layer has a refractive index lower than that of the phase difference detection filter.

21 Claims, 24 Drawing Sheets

FIG. 2

IMAGE SENSOR INCLUDING A PHASE DIFFERENCE DETECTION PIXEL HAVING A LINING LAYER

CROSS-REFERENCE TO RELATED APPLICATION

This patent document claims priority under 35 U.S.C. § 119 to Korean Patent Application No. 10-2018-0034371 filed on Mar. 26, 2018, which is incorporated herein by reference in its entirety.

TECHNICAL FIELD

The technology and implementations disclosed in this patent document relate to an image sensor including an image sensor which includes a phase difference detection pixel.

BACKGROUND

With the recent development of the information communication industry and the digitalization of electronic devices, image sensors with improved performance have been used in various fields such as a digital camera, a camcorder, a mobile phone, a PCS (personal communication system), a game machine, security camera and a medical micro camera. In general, an image sensor has a pixel region which includes photodiodes that generate photoelectrons in response to an incident light and a peripheral circuit region that processes signals corresponding to the generated photoelectrons. The pixel region includes a plurality of unit pixels, and the peripheral circuit region includes a plurality of transistors. The unit pixels include image pixels and phase difference detection pixels. The phase difference detection pixels include a left phase difference detection pixel and a right phase difference detection pixel.

SUMMARY

Various embodiments are directed to an image sensor which improves the light receiving efficiency and the phase difference detection sensitivity of a phase difference detection pixel.

Various embodiments are directed to an image sensor capable of reducing a crosstalk phenomenon and a diffused reflection phenomenon.

In an embodiment, an image sensor may include a substrate; an image photo sensor formed in the substrate to receive incident light and to produce an image signal representing a received portion of the incident light for forming an image; a phase difference detection photo sensor formed in the substrate to receive a portion of the incident light to convert the received light into a phase difference detection signal representing a phase of the image; an antireflection layer formed over the substrate to reduce optical reflection of the incident light received by the image photo sensor and the phase difference detection photo sensor; a grid pattern and a guide pattern formed over the antireflection layer; a color filter formed over the antireflection layer and the image photo sensor to transmit light in the incident light at a selected color to reach the image photo sensor for producing the image signal; a phase difference detection filter formed over the antireflection layer and the phase difference detection photo sensor to transmit light in the incident light at a selected color to reach the phase difference detection photo sensor for producing the phase difference detection signal; and a lining layer formed of a transparent layer having a refractive index lower than a refractive index of the phase difference detection filter and located to transmit light filtered by the phase difference detection filter. The lining layer may be structured to include a portion located between the color filter and the phase difference detection filter.

In an embodiment, an image sensor may include an antireflection layer formed over a substrate; grid patterns and a guide pattern that are disposed over the antireflection layer; a color filter between the grid patterns; a phase difference detection filter structured to include a portion between one of the grid patterns and the guide pattern; and a lining layer formed to include a portion between one of the grid patterns and the phase difference detection filter. The lining layer may have a refractive index lower than that of the phase difference detection filter.

In an embodiment, an image sensor may include a substrate including an image photodiode to receive incident light and to produce an image signal representing a received portion of the incident light for forming an image and a phase difference detection photodiode to receive a portion of the incident light to convert the received light into a phase difference detection signal representing a phase of the image; an antireflection layer disposed over the substrate; a color filter disposed over the antireflection layer and overlapping with the image photodiode to filter light that is incident to the image photodiode; a phase difference detection filter disposed over the antireflection layer and overlapping with the phase difference detection photodiode to filter light that is incident to the phase difference detection photodiode to filter light that is incident to the image; and a lining layer formed in contact with the phase difference detection filter to include a portion between the color filter and the phase difference detection filter. The lining layer may have a refractive index lower than a refractive index of the phase difference detection filter and a refractive index of the color filter.

In an embodiment, an image sensor may include: an image photodiode and a phase difference detection photodiode formed in a substrate; an antireflection layer formed over the substrate; a grid pattern and a guide pattern formed over the antireflection layer; a color filter and a phase difference detection filter formed over the antireflection layer to be vertically aligned with the image photodiode and the phase difference detection photodiode, respectively; and a lining layer formed between the color filter and the phase difference detection filter. The lining layer may have a refractive index lower than that of the phase difference detection filter.

In an embodiment, an image sensor may include: an antireflection layer formed over a substrate; grid patterns and a guide pattern over the antireflection layer; a color filter between the grid patterns; a phase difference detection filter between one of the grid patterns and the guide pattern; and a lining layer formed between one of the grid patterns and the phase difference detection filter. The lining layer may have a refractive index lower than that of the phase difference detection filter.

In an embodiment, an image sensor may include: a substrate including an image photodiode and a phase difference detection photodiode; an antireflection layer over the substrate; a color filter vertically aligned and overlapping with the image photodiode over the antireflection layer; a phase difference detection filter vertically aligned and overlapping with the phase difference detection photodiode over the antireflection layer; and a lining layer between the color filter and the phase difference detection filter. The lining layer may have a refractive index lower than that of the phase difference detection filter and the color filter.

BRIEF DESCRIPTION OF THE DRAWINGS

FIG. 2 is a schematic layout diagram illustrating a representation of an example of a pixel array of an image sensor in accordance with an embodiment of the disclosed technology.

DETAILED DESCRIPTION

Figure 1:
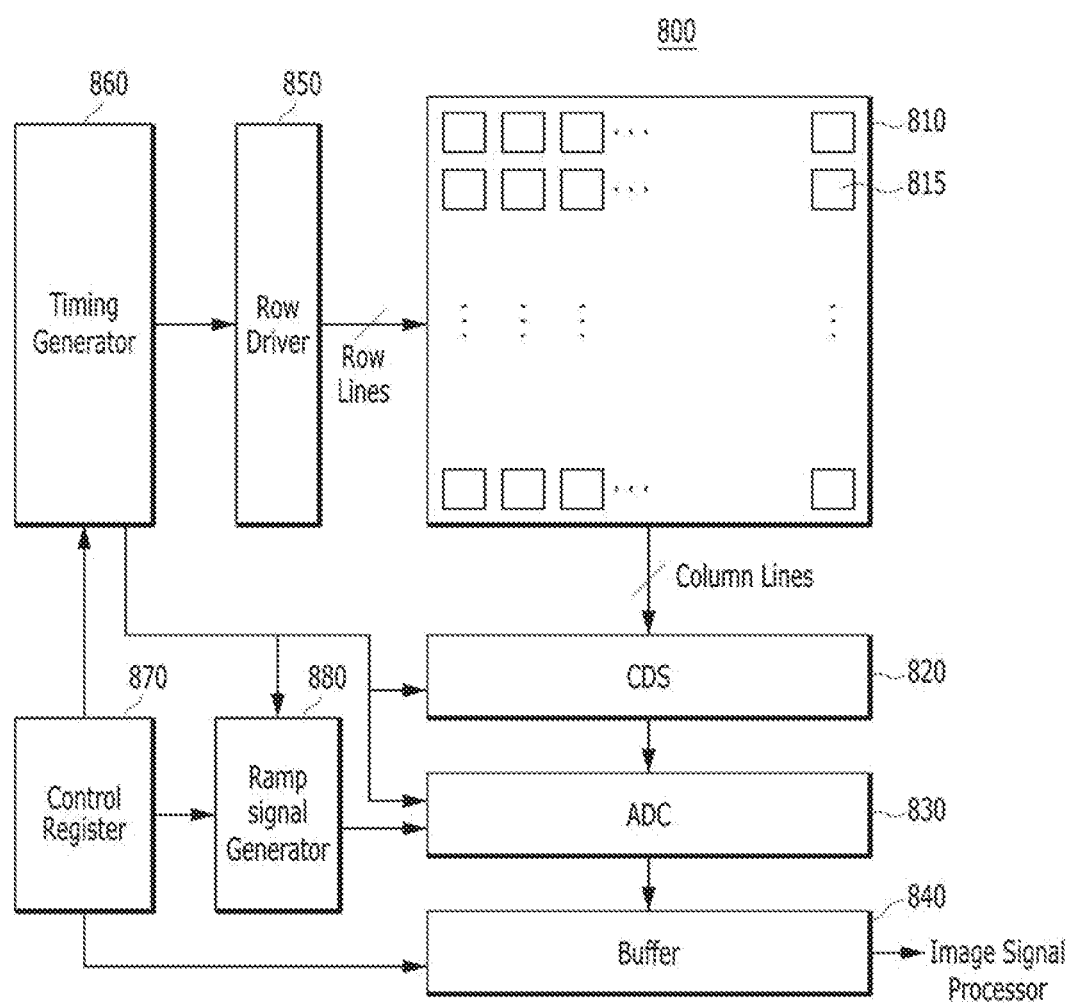
FIG. 1 is a block diagram schematically illustrating a representation of an example of an image sensor in accordance with an embodiment of a disclosed technology.

An image sensor array can be designed to include imaging pixels and phase difference detection pixels where the imaging pixels are designed and operated for capturing incident light to represent a subject or a scene as a color image, and the phase difference detection pixels are designed and operated for capturing incident light at different phase difference detection pixels to detect a phase of a captured image or scene. Such phase information can be used for improving the imaging quality or operation, including, e.g., implementing auto-focusing and representing a three-dimensional representation of the captured image or scene. In some implementations of phase difference detection pixels, two different phase detection pixels can be paired to obtain signals that can be processed to measure the distance difference or the phase of a detected image.

The disclosed technology can be implemented to provide an image sensor with a lining layer on a phase difference detection filter.

The disclosed technology provides the lining layer to have a refractive index lower than that of color filters and/or that of a phase difference detection filter. Since the lining layer satisfies such characteristics of the refractive index, the total reflection of incident light can occur at the interface between the lining layer and the phase difference detection filter. Accordingly, it is possible to increase the amount of light received in a phase difference detection photodiode and prevent an influence by a crosstalk phenomenon.

Embodiments of the disclosed technology will be described with reference to cross-sectional views and/or plan views which have been shown and described by way of illustration. In the drawings, the thicknesses of layers and regions may be exaggerated for clarity of illustration. Thus, the illustrated views may be modified depending on fabrication techniques and/or allowable errors. Therefore, embodiments of the disclosed technology are not limited to specific shapes illustrated in the drawings but may include other shapes which are created according to a fabrication process. For example, an angled region may have a curved shape or a certain curvature. Therefore, regions illustrated in the drawings are schematic in nature and their shapes are not intended to illustrate the precise shape of an element and are not intended to limit the scope of the disclosed technology.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

FIG. 1 is a diagram schematically illustrating an example of an image sensor 800 based on an embodiment of the disclosed technology. Referring to FIG. 1, an image sensor 800 may include a pixel array 810, a correlated double sampler (CDS) 820, an analog-to-digital converter (ADC) 830, a buffer 840, a row driver 850, a timing generator 860, a control register 870, and a ramp signal generator 880.

The pixel array 810 may include a plurality of pixel blocks 815 that are arranged in columns and rows in a matrix structure. Each pixel block 815 may include a block of imaging pixels each of which may include at least one photosensing element (i.e., photo sensor) that converts light into electrical charge, a voltage or current signal and such a photosensing element may be implemented by a photodiode, a photo transistor, a photo gate, or other photosensitive circuitry capable of converting light into a pixel signal (e.g., charge, a voltage or a current). The pixel blocks 815 may transform optical image information to electrical image signals and transmit the image signals to the correlated double sampler 820 through corresponding column lines. Each of the pixel blocks 815 may be electrically connected to one of the row lines and one of the column lines.

The correlated double sampler 820 may hold and sample the electrical image signals that are received from the pixels of pixel blocks 815 within the pixel array 810. For example, the correlated double sampler 820 may sample a reference voltage level and voltage levels of the received electrical image signals from pixel blocks 815 according to a clock signal provided by the timing generator 860, and transmit analog signals corresponding to the difference between the two voltage levels to the analog-to-digital converter 830.

The analog-to-digital converter 830 may convert the received analog signals into digital signals and transfer the digital signals to the buffer 840. The buffer 840 may store or latch the digital signals received from the analog-to-digital converter 830 and sequentially output the digital signals to an external image signal processor. The buffer 840 may include a memory to temporarily store or latch the digital signals, and a sense amplifier to amplify the digital signals.

The row driver 850 may drive pixels of the pixel blocks 815 in the pixel array 810 according to timing signals transmitted from the timing generator 860. For example, the row driver 850 may generate selecting signals to select one of the row lines and/or driving signals to drive one of the row lines.

The timing generator 860 may generate timing signals to control the correlated double sampler 820, the analog-to-digital converter 830, the row driver 850, and the ramp signal generator 880.

The control register 870 may generate control signals to control the buffer 840, the timing generator 860, and the ramp signal generator 880.

The ramp signal generator 880 may generate a ramp signal to control the electrical image signals to be output from the analog-to-digital convertor 830 to the buffer 840 according to the timing generator 860.

Each imaging pixel can also include a charge storage region for storing the photo-generated charges, which may be constructed as, for example, a floating diffusion region as disclosed in the examples below. Additional circuitry may be included in each imaging pixel, e.g., a transfer transistor for transferring the photo-generated charges from the photosensor to the storage region and a reset circuitry for resetting the charges in the charge storage region after a readout.

Figure 2:
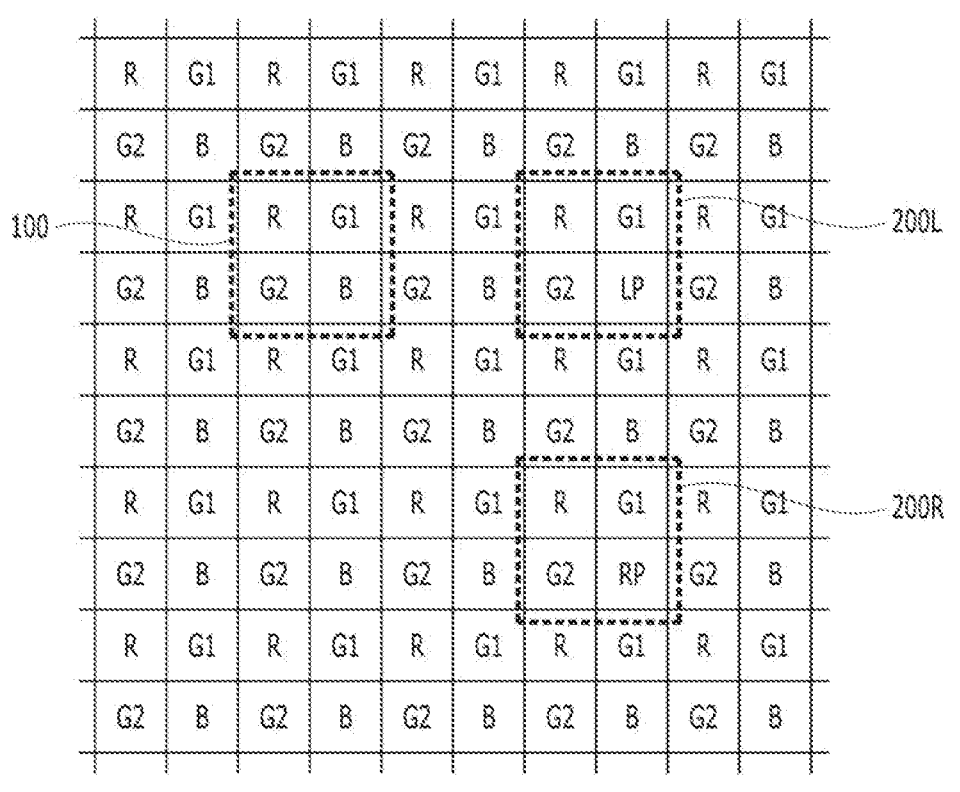

FIG. 2 is a schematic layout diagram illustrating a representation of an example of a pixel array of an image sensor in accordance with an embodiment of the disclosed technology. Referring to FIG. 2, the pixel array of the image sensor in accordance with the embodiment of the disclosed technology may include a plurality of image pixel blocks 100 which perform optical detection for capturing images and phase difference detection pixels which detect a phase of a captured image. Phase difference detection is achieved by adding phase difference detection pixels to the pixel array 810. The signals output from the phase difference detection pixels are used to detect phase differences between signals generated by different phase difference detection pixels. The phase difference detection pixels include a left phase difference detection pixel block 200L and a right phase difference detection pixel block 200R which are arranged in a matrix form.

Each of the image pixel blocks 100 may include image pixels R, G1, G2, and B which are arranged in rows and columns in a matrix form. An array of different color filters may be arranged on the image pixels in the pixel array 810 such that the light of a specific color is input to each pixel. For example, each of the image pixel blocks 100 may include three different color filters for capturing color information in each image pixel block 100. One example way of arranging the colors of the color filters is the well-known Bayer color filter pattern of a repetitive Bayer color filter unit patterns with each unit pattern having 2 green color filter pixels, 1 blue color filter pixel, and 1 red color filter pixel. In the illustrated example in FIG. 2, a red pixel R, first and second green pixels G1 and G2, and a blue pixel B are provided within each image pixel block 100 based on the Bayer pattern. On top of the imaging pixels, the color filters are placed to cover the photosensing pixels to filter the incident light in different colors at different pixel locations to capture the color information in a sensed image. The red pixel R, the first and second green pixels G1 and G2, and the blue pixel B of each of the image pixel blocks 100 may receive light of respective corresponding colors and generate photoelectrons corresponding to those colors.

In this example, the left phase difference detection pixel block 200L and the right phase difference detection pixel block 200R are located at different locations from the image pixel blocks 100, The left phase difference detection pixel block 200L may include a red pixel R, first and second green pixels G1 and G2, and a left phase difference detection pixel LP, and the right phase difference detection pixel block 200R may include a red pixel R, first and second green pixels G1 and G2, and a right phase difference detection pixel RP. Each of the left phase difference detection pixel LP and the right phase difference detection pixel RP may analyze an information on the phase difference of light depending on the incident angle of light and may activate an auto-focusing function.

While it is illustrated in the present embodiment that the left and right phase difference detection pixels LP and RP replace the blue pixel B of the image pixel block 100, other implementations are also possible. For example, it is to be noted that, in other embodiments of the present disclosure, each of the left and right phase difference detection pixels LP and RP may replace one of the red pixel R, the first green pixel G1, and the second green pixel G2 other than the blue pixel B.

Figure 3A:
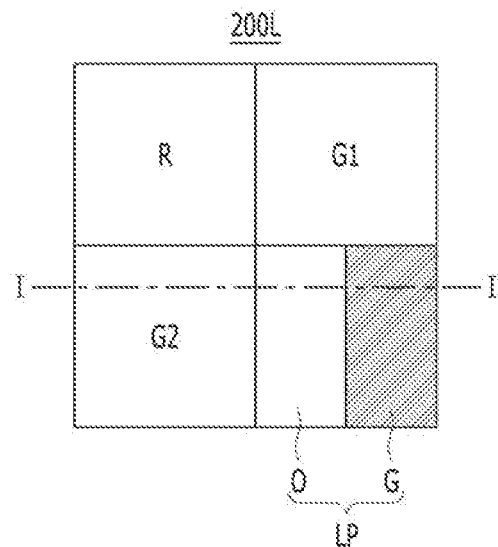
FIGS. 3A and 3B are schematic layout diagrams illustrating representations of examples of phase difference detection pixels of phase difference detection pixel blocks of an image sensor in accordance with an embodiment of the disclosed technology.
Figure 3B:
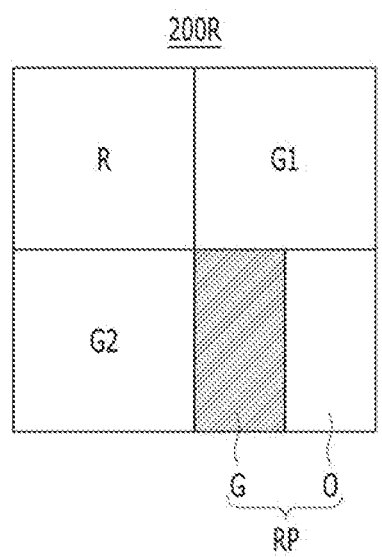

FIGS. 3A and 3B are schematic layout diagrams illustrating representations of examples of phase difference detection pixels LP and RP of the phase difference detection pixel blocks 200L and 200R of an image sensor in accordance with an embodiment of the disclosed technology. Referring to FIGS. 3A and 3B, the left phase difference detection pixel block 200L of the image sensor in accordance with the embodiment of the disclosed technology may include the left phase difference detection pixel LP, and the right phase difference detection pixel block 200R may include the right phase difference detection pixel RP. The left phase difference detection pixel LP may include an opening O which is positioned on a left side of the left phase difference detection pixel LP and a guide pattern G which is positioned on a right side of the left phase difference detection pixel LP. The right phase difference detection pixel RP may include a guide pattern G which is positioned on a left side of the right phase difference detection pixel RP and an opening O which is positioned on a right side of the right phase difference detection pixel RP. The locations of the opening O and the guide pattern G can be modified. For example, in another embodiment of the disclosed technology, the right phase difference detection pixel RP may include an opening O on the left side of the right phase difference detection pixel RP and a guide pattern G on the right side of the right phase difference detection pixel RP, and the left phase difference detection pixel LP may include a guide pattern G on the left side of the left phase difference detection pixel LP and an opening O on the right side of the left phase difference detection pixel LP.

FIGS. 4A to 4D are longitudinal cross-sectional views of the left phase difference detection pixel block 200L taken along the line of FIG. 3A. The right phase difference detection pixel block 200R has a form which is symmetrical to the left phase difference detection pixel block 200L. Thus, the structures of the phase difference detection pixel blocks 200A to 200D as shown in FIGS. 4A to 4D will be accordingly applied to the left phase detection pixel block 200L and the right phase detection pixel block 200R.

Figure 4A:
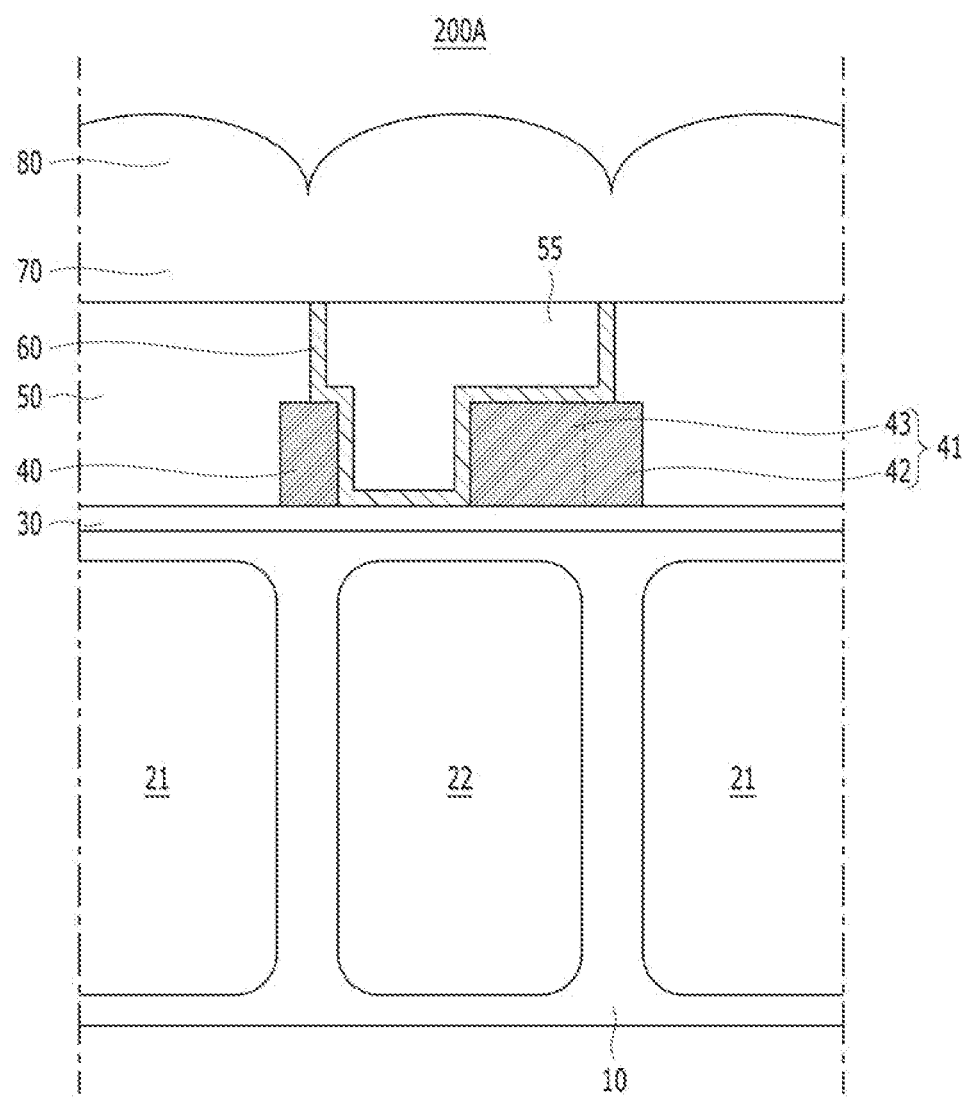
FIGS. 4A to 4D and 5A to 5D are longitudinal cross-sectional views of an example of a left phase difference detection pixel block taken along the line I-I' of FIG. 3A.

Referring to FIG. 4A, the phase difference detection pixel block 200A of an image sensor in accordance with an embodiment of the disclosed technology may include photodetectors or photosensing elements such as photodiodes 21 and 22 in a substrate 10, an antireflection layer 30 formed in the path of the incident light on the substrate 10 to reduce optical reflection and to increase light collection efficiency at the photo detectors or photosensing elements (i.e., photo sensor), grid patterns 40, a guide pattern 41, color filters 50, a phase difference detection filter 55, a lining layer 60, an overcoat layer 70, and micro lenses 80.

The substrate 10 may include a single-crystalline silicon layer, and the photodiodes 21 and 22 may be or include N-doped regions which include N-type ions doped in the substrate 10. The photodiodes 21 and 22 may include image photodiodes 21 and a phase difference detection photodiode 22. The image photodiodes 21 may receive light transmitted through the color filters 50 and generate photoelectrons which have image information. The phase difference detection photodiode 22 may generate photoelectrons which have an information on the incident angle of light transmitted through the phase difference detection filter 55. The amount of photoelectrons generated in the phase difference detection photodiode 22 may vary depending on the incident angle of light transmitted through the phase difference detection filter 55. The substrate 10 may include doped N-type ions, and the spaces between the photodiodes 21 and 22 may include doped P-type ions.

The antireflection layer 30 may include planarized dielectric layers which are stacked in a single layer or a multi-layer. For example, the antireflection layer 30 may include at least one of a silicon nitride (SiN) layer, a silicon oxide ($SiO_2$) layer, a silicon oxynitride (SiON) layer, a carbon-containing silicon oxide (SiCO) layer, a carbon-containing silicon nitride (SiCN) layer, an aluminum oxide ($Al_2O_3$) layer, a hafnium oxide ($HfO_2$) layer, or a tantalum oxide ($Ta_2O_5$) layer, or combinations thereof.

The grid patterns 40 may be formed in the form of a mesh when viewed from the top. A grid pattern 40 may be disposed between the lower portions of one of the color filters 50 and the phase detection filter 55 and separate the lower portion of the color filter 50 from the lower portion of the phase difference detection filter 55. For example, the color filters 50 and the phase difference detection filter 55 may be filled in spaces which are formed by the grid patterns 40. The grid patterns 40 may be vertically aligned with the spaces between the photodiodes 21 and 22. The grid patterns 40 may include an opaque material, for example, a metal such as tungsten (W).

The guide pattern 41 may include a grid part 42 and a guide part 43. The grid part 42 may have the same form as the grid pattern 40. In some implementations, the grid part 42 may be a portion of the grid patterns 40. The guide part 43 may extend from the grid part 42 and be disposed to cover at least a portion of the phase difference detection photodiode 22. Thus, the guide part 43 may provide a blind region which partially blinds the phase difference detection photodiode 22 by covering the phase difference detection photodiode 22. The grid part 42 and the guide part 43 may be physically and materially integrated. For example, the guide pattern 41 may include the same material as the grid patterns 40. A virtual boundary between the grid part 42 and the guide part 43 is indicated by the dotted line. The virtual boundary may be aligned to an edge of the phase difference detection photodiode 22. In some implementation, the grid part 42 may be disposed over a region between the phase difference detection photodiode 22 and the image photodiode 21.

The color filters 50 may be formed between the grid patterns 40. The color filters 50 may have portions vertically overlapping and being aligned with the image photodiodes 21. In addition, the color filters 50 may have portions vertically overlapping and being aligned partially with the space between the image photodiodes 21. Each of the color filters 50 may include a thermosetting resin containing or including one of a red pigment, a green pigment, or a blue pigment. For example, the color filters 50 may include a polymeric material such as a polystyrene-based resin, a polyimide-based resin, a polysiloxane-based resin, an acrylic-based resin, an epoxy-based resin, or a copolymer resin thereof, or a silicon oxide-based or silicon nitride-based inorganic material.

At least a portion of the phase difference detection filter 55 may be surrounded by the lining layer 60 and be formed between the grid pattern 40 and the guide pattern 41 and between adjacent color filters 50. The phase difference detection filter 55 may vertically overlap with the phase difference detection photodiode 22. In some implementations, the phase difference detection filter 55 may be aligned with the phase difference detection photodiode 22. The phase difference detection filter 55 may include a white filter, a green filter, or a transparent organic or inorganic material having a high light transmittance. For example, the phase difference detection filter 55 may include a thermosetting material which does not contain a pigment or a thermosetting material which contains a green pigment. For example, the phase difference detection filter 55 may include a polymeric material such as a polystyrene-based resin, a polyimide-based resin, a polysiloxane-based resin, an acrylic-based resin, an epoxy-based resin, or a copolymer resin thereof, or a silicon oxide-based or silicon nitride-based inorganic material.

The lining layer 60 may be disposed to surround portions of the phase difference detection filter 55 except the top surface of the phase difference detection filter 55. The lining layer 60 may have a shape corresponding to the shape of the phase difference detection filter 55. For example, in the specific implementation as shown in FIG. 4A, the phase difference detection filter 55 has an upper portion and a lower portion, and the width of the upper portion is greater than that of the lower portion. The lining layer 60 may be formed on the exposed surface of the antireflection layer 30, the exposed sidewalls and top surfaces of the grid pattern 40 and the guide pattern 41, and the sidewalls of the color filters 50. In some implementations, the lining layer 60 may be conformally extended from portions of the antireflection layer 30, the grid pattern 40 and the guide pattern 41. For example, the lining layer 60 may be disposed between the top surface of the antireflection layer 30, and the bottom surface of the lower portion of the phase difference detection filter 55, between the sidewall and top surface of the grid pattern 40 and the sidewall of the lower portion and the bottom surface of the upper portion of the phase difference detection filter 55, between the sidewalls of the color filters 50 and the sidewalls of the upper portion of the phase difference detection filter 55, and between the sidewall and top surface of the guide part 43 of the guide pattern 41 and the sidewall of the lower portion and the bottom surface of the upper portion of the phase difference detection filter 55. In other words, the lining layer 60 may cover the bottom and side surfaces of the phase difference detection filter 55 in the form of a bowl. The lining layer 60 may include a polymeric material such as a polystyrene-based resin, a polyimide-based resin, a polysiloxane-based resin, an acrylic-based resin, an epoxy-based resin, or a copolymer resin thereof, or a silicon oxide-based or silicon nitride-based inorganic material.

The top surfaces of the color filters 50, the phase difference detection filter 55, and the lining layer 60 may be coplanar. The color filters 50 and the phase difference detection filter 55 may have substantially the same or similar refractive index. The lining layer 60 may have a refractive index lower than that of the color filters 50 and the phase difference detection filter 55. Since the refractive index of the lining layer 60 is lower than that of the phase difference detection filter 55, the total reflection of incident light may occur at the interface between the lining layer 60 and the phase difference detection filter 55.

The overcoat layer 70 may include a polymeric organic material such as a polyimide-based resin, a polystyrene-based resin, an acrylic-based resin, or an epoxy-based resin, or a combination thereof, or an inorganic material such as a silicon oxide.

The micro lenses 80 may be arranged to be vertically aligned with the color filters 50 and the phase difference detection filter 55. For example, the micro lenses 80 may be arranged over the image photodiodes 21 and the phase difference detection photodiode 22. The micro lenses 80 may have hemispherical surfaces. The micro lenses 80 may include a polymeric organic material such as a polyimide-based resin, a polystyrene-based resin, an acrylic-based resin, or an epoxy-based resin, or a combination thereof, or an inorganic material such as a silicon oxide. For example, the micro lenses 80 may include the same material as the overcoat layer 70.

Figure 4B:
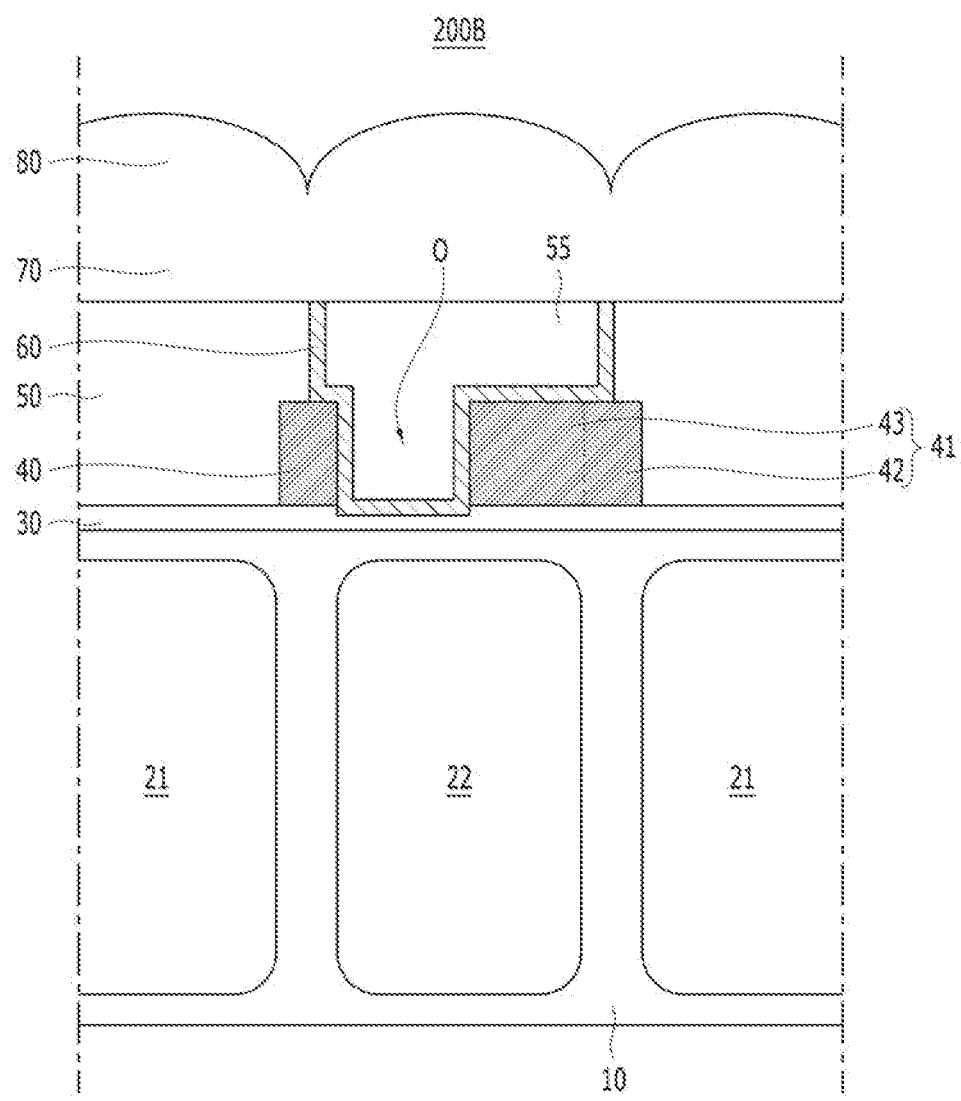

Referring to FIG. 4B, the phase difference detection pixel block 200B of an image sensor in accordance with an embodiment of the disclosed technology may include an antireflection layer 30 which is recessed around a bottom surface of an opening O, when compared to the phase difference detection pixel block 200A shown in FIG. 4A. For example, the antireflection layer 30 may be partially removed and recessed at the bottom of the opening O. As the antireflection layer 30 is partially removed and recessed, a transmittance of which the light transmitted through the phase difference detection filter 55 is incident on the phase difference detection photodiode 22 may increase. Thus, as the light receiving amount and light receiving efficiency of the phase difference detection photodiode 22 are increased, the phase difference detection sensitivity of the phase difference detection photodiode 22 may become excellent.

Figure 4C:
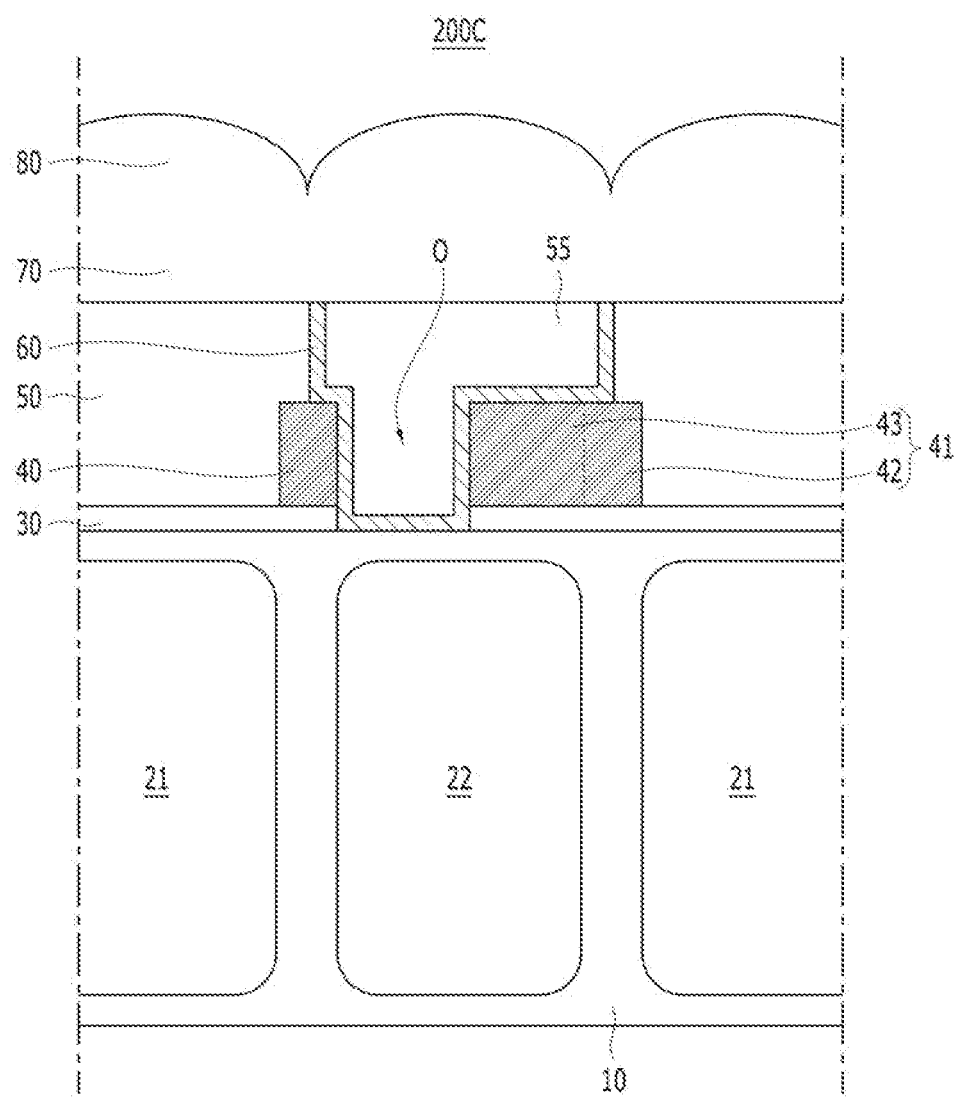

Referring to FIG. 4C, the phase difference detection pixel block 200C of an image sensor in accordance with an embodiment of the disclosed technology may include an antireflection layer 30 which is completely removed around the bottom of an opening O, when compared to the phase difference detection pixel block 200B shown in FIG. 4B. Therefore, the surface of the substrate 10 and the lining layer 60 may be in direct contact with each other without having the antireflection layer 30 between the substrate 10 and the lining layer 60. As the antireflection layer 30 over the phase difference detection photodiode 22 is completely or partially removed, the transmittance of light which is incident on the phase difference detection photodiode 22 can be further increased.

Figure 4D:
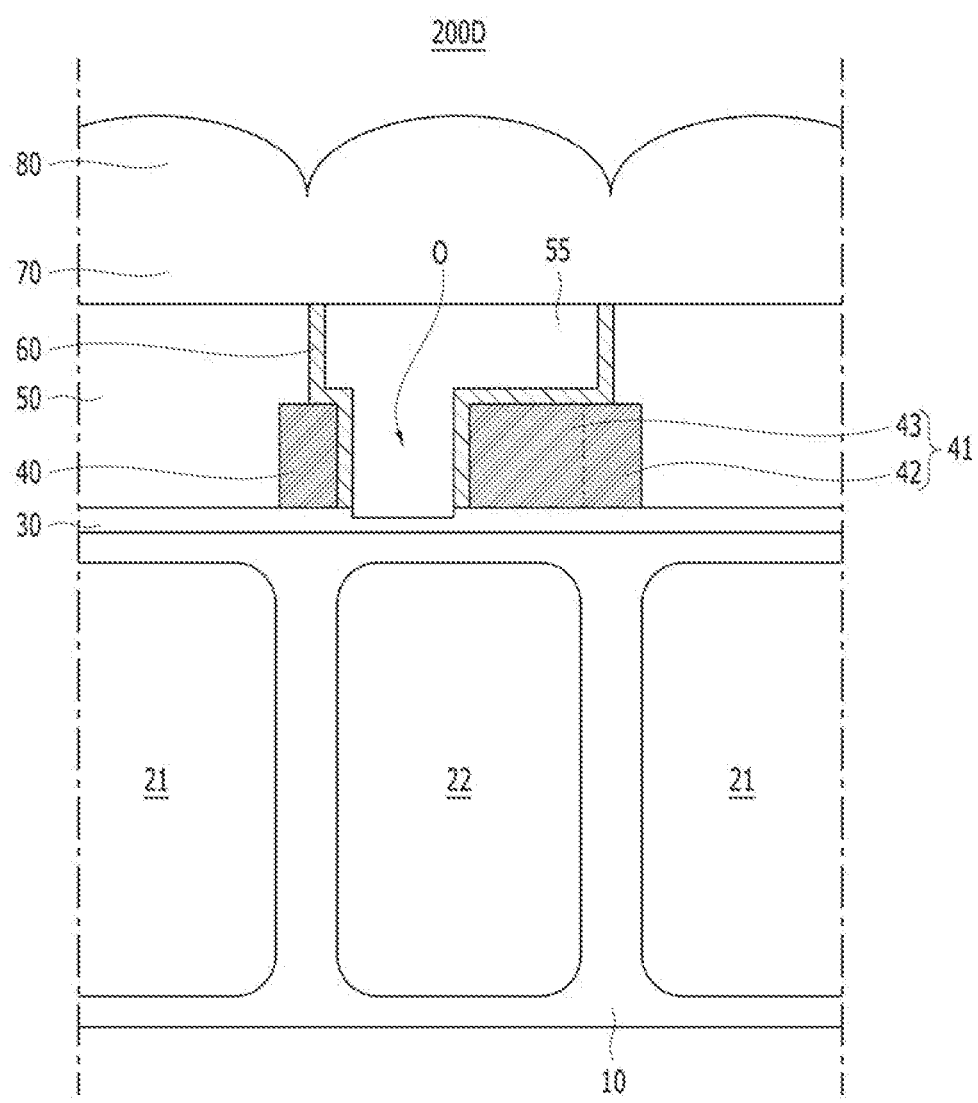

Referring to FIG. 4D, the phase difference detection pixel block 200D of an image sensor in accordance with an embodiment of the disclosed technology may include a lining layer 60 which is conformally formed along the sidewalls of the phase difference detection filter 55 and not formed on the bottom surface of the phase difference detection filter 55, when compared to the phase difference detection pixel blocks 200A to 200C shown in FIGS. 4A to 4C. Referring to FIG. 4D, the lining layer 60 may be disposed on the sidewalls and top surfaces of the grid pattern 40 and the guide pattern 41 and the sidewalls of the color filters 50. The lining layer 60 may not be formed on the surface of the antireflection layer 30 at or around the bottom of an opening O. As the lining layer 60 is not formed at or around the bottom of the opening O, the transmittance of light incident on the phase difference detection photodiode 22 can be further increased.

Figure 5A:
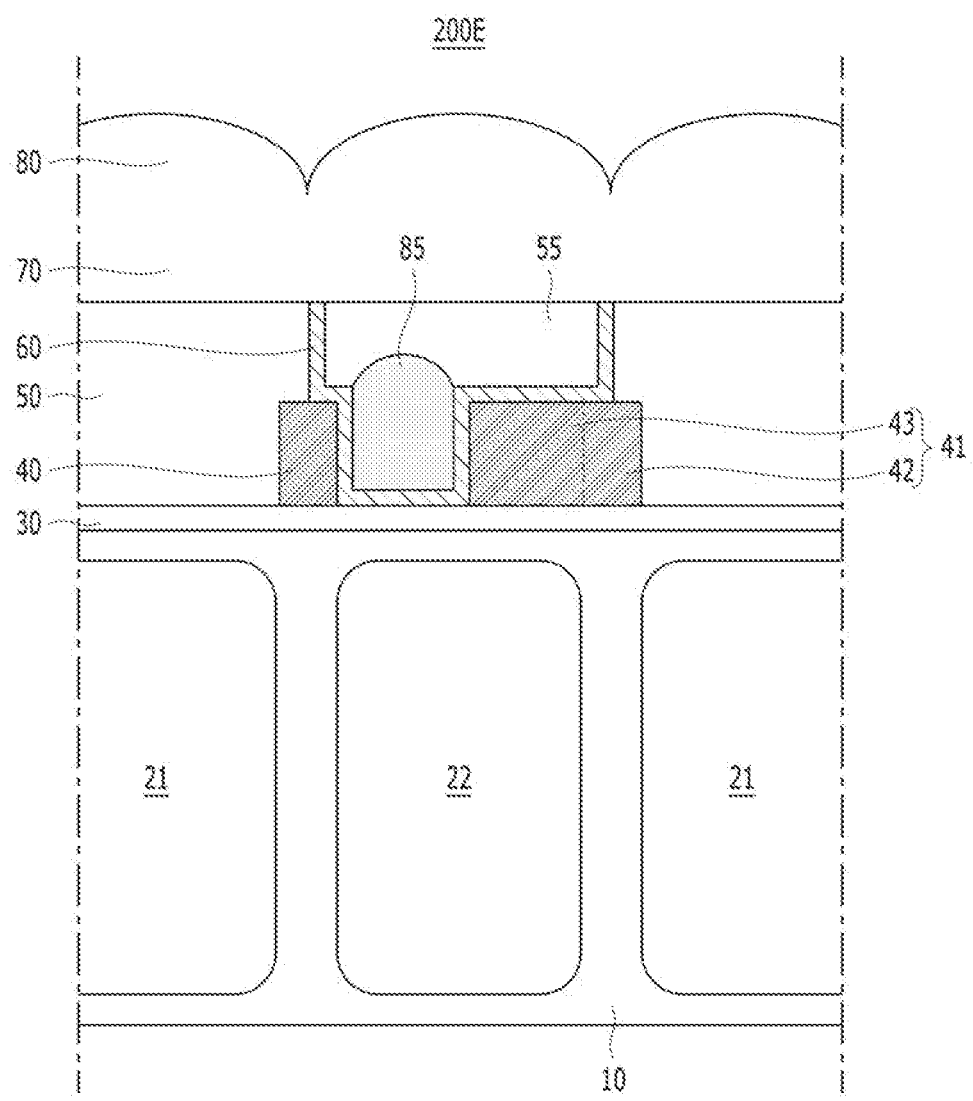
Figure 5B:
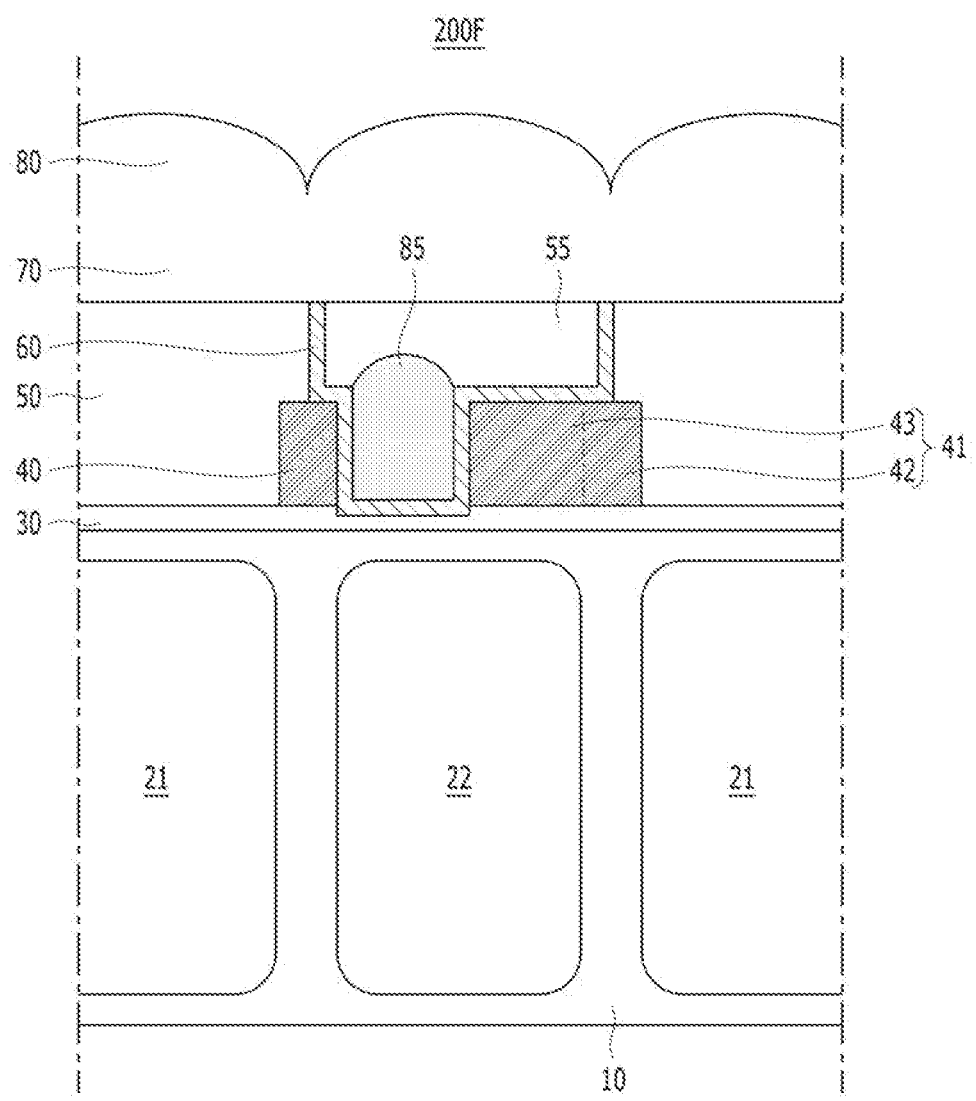
Figure 5C:
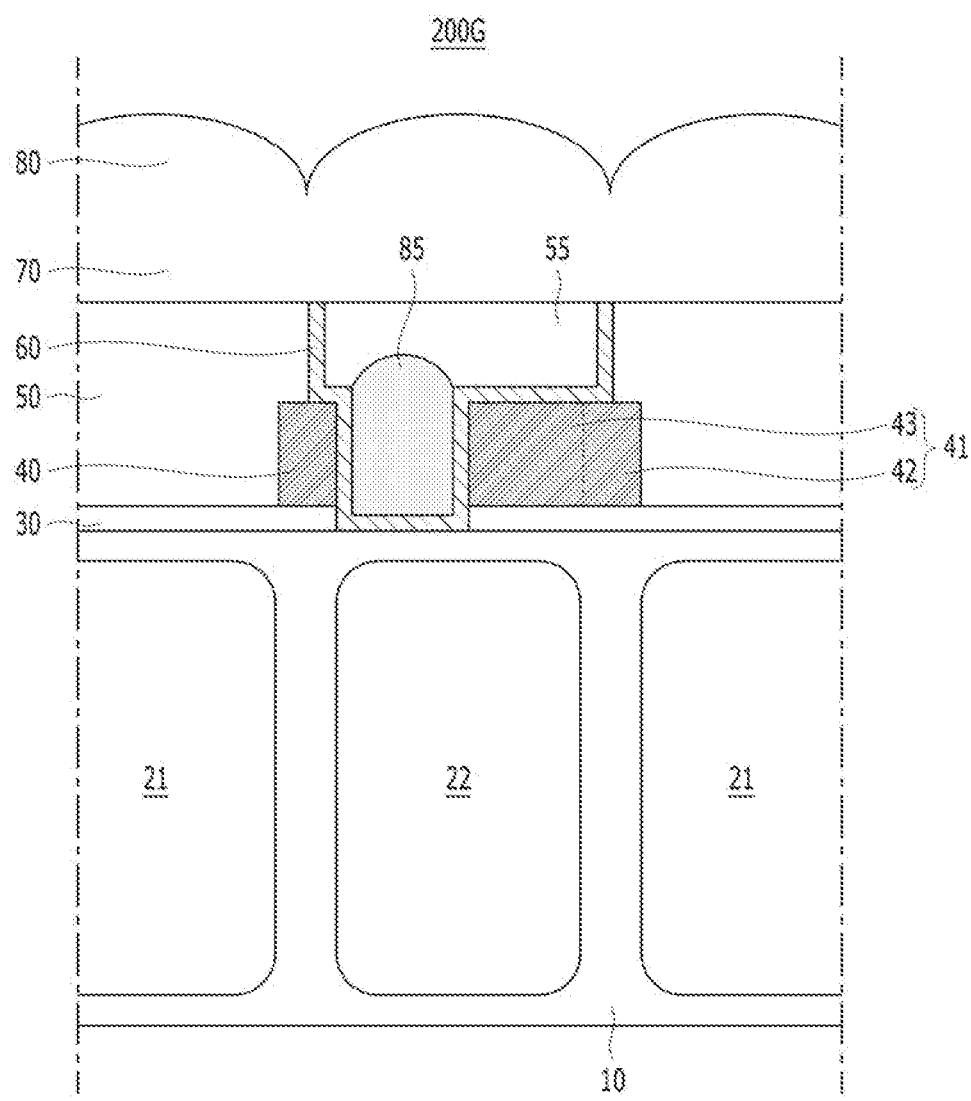
Figure 5D:
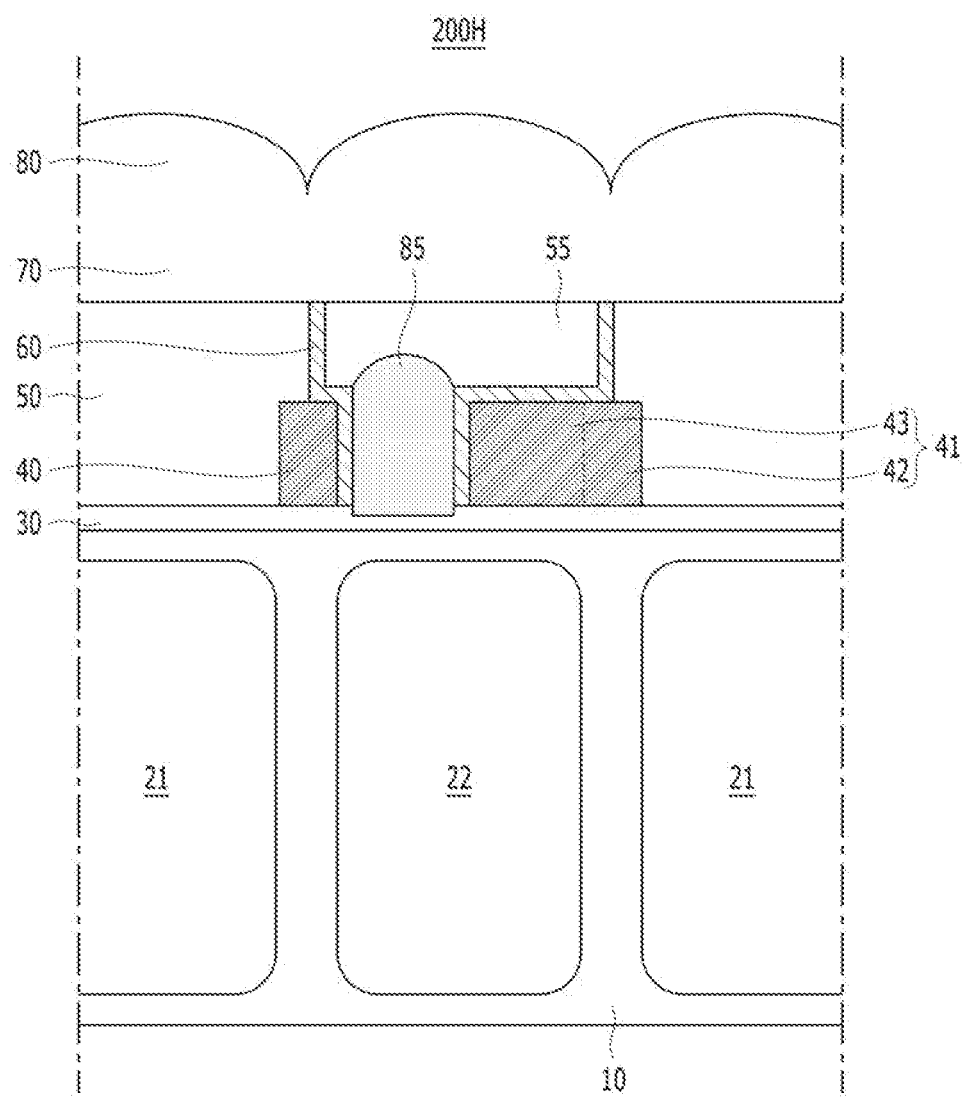

FIGS. 5A to 5D are other examples of longitudinal cross-sectional views of the left phase difference detection pixel block 200L taken along the line of FIG. 3A. As in FIGS. 4A to 4D, the structures of phase difference detection pixel blocks 200E to 200H will be accordingly applied to the left phase difference detection pixel block 200L and the right phase difference detection pixel block 200R. Referring to FIGS. 5A to 5D, the phase difference detection pixel blocks 200E to 200H of image sensors in accordance with various embodiments of the disclosed technology may further include internal lenses 85 in addition to the corresponding phase difference detection pixel blocks 200A to 200D shown in FIGS. 4A to 4D. The internal lens 85 may be filled in the space between the grid pattern 40 and the guide part 43 of the guide pattern 41. Thus, the internal lens 85 may be filled in an opening O. The internal lens 85 may have a hemispherical upper surface which convexly protrudes upward out of the top surface of the guide part 43 of the guide pattern 41. The internal lens 85 may have a refractive index higher than that of the phase difference detection filter 55. For example, the internal lens 85 may include the same material as the micro lenses 80. In FIG. 5D, the bottom surface of the internal lens 85 may be in direct contact with the antireflection layer 30.

Figure 6:
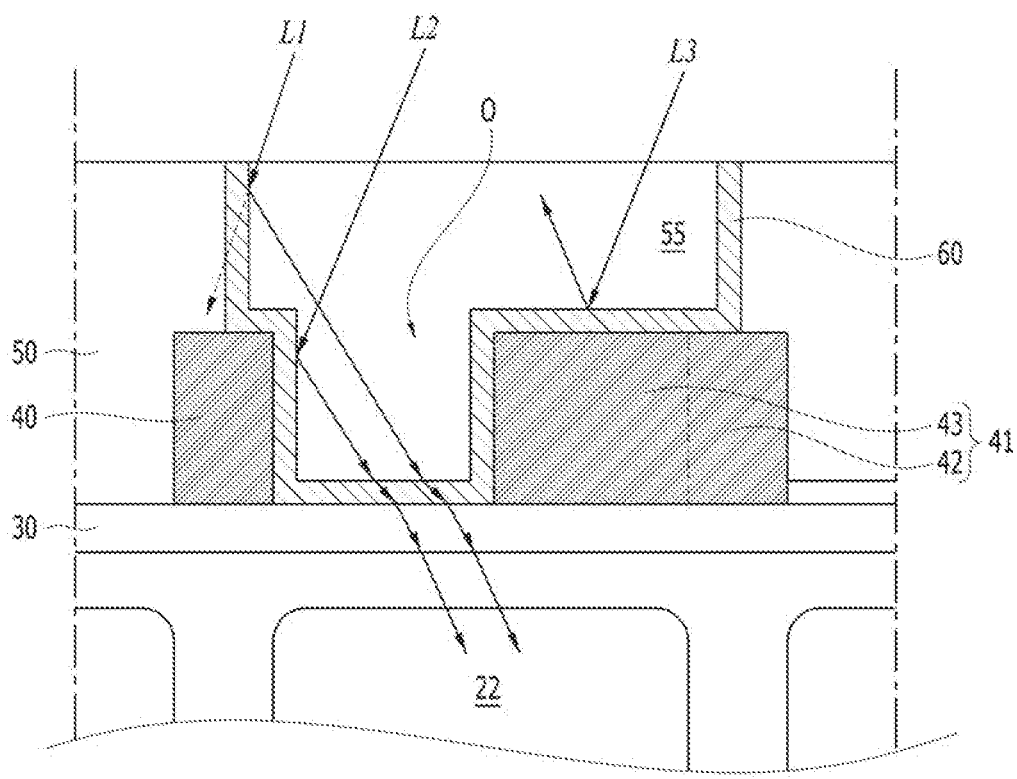
FIG. 6 is a diagram schematically illustrating an example of a light path that changes depending on an incident angle of light in a phase difference detection pixel.

FIG. 6 is a diagram schematically illustrating that a path along which light travels changes depending on the incident angle of light in the phase difference detection pixels LP and RP.

As the first light L1 travels through the phase difference detection filter 55, the first light L1 arrives at the interface between the phase difference detection filter 55 and the lining layer 60 and is totally reflected. The reflected first light L1 can be incident on the phase difference detection photodiode 22 (see the solid arrow). In the case where the lining layer 60 is not formed, since a portion of the first light L1 can proceed to the adjacent color filter 50 (see the dotted arrow), the amount of light arriving at the interface between the phase difference detection filter 55 and the photodiode 22 decreases. Since the light receiving amount of the phase difference detection photodiode 22 decreases, an influence by a crosstalk phenomenon can be increased.

Second light L2 is incident to a different location or path from the first light L1. For example, the second light L2 is incident on the lining layer 60 on the sidewall of the grid pattern 40 and in the opening O. The second light L2 can be totally reflected at the interface between the phase difference detection filter 55 and the lining layer 60, and the reflected second light L2 can be incident on the phase difference detection photodiode 22 (see the solid arrow). In the case where the lining layer 60 is not formed on the sidewall of the grid pattern 40, since a portion of the second light L2 can be directly incident on the grid pattern 40 and absorbed by the grid pattern 40, the amount of the light arriving at the phase difference detection photodiode 22 may decrease. Thus, if the lining layer 60 is not formed on the gird pattern 40, the loss of light may occur.

Third light L3 is incident to a different location or path from the first light L1 and the second light L2. For example, the second light L2 is incident on the top surface of the guide part 43 of the guide pattern 41 and be reflected from the top surface of the guide part 43 of the guide pattern 41. With the lining layer 60 on the top surface of the guide part 43 of the guide pattern 41, the third light L3 can be partly absorbed by the lining layer 60 on the top surface of the guide part 43 of the guide pattern 41, and thus, an amount of reflected light can be reduced. The reflected light can cause a diffused reflection, and/or can be reflected back to cause a flare phenomenon. Therefore, the lining layer 60 can mitigate the flare phenomenon of the image sensor.

In addition, in the case where the internal lens 85 is present as shown in FIGS. 5A to 5D, the path of light can be further concentrated toward the phase difference detection photodiode 22 by the internal lens 85.

By the lining layer 60, the amount of light incident on the phase difference detection photodiode 22 can be increased, and accordingly, the phase difference detection sensitivity of the phase difference detection photodiode 22 can become excellent. Since the lining layer 60 suppresses light from being directed to the adjacent color filter 50, a crosstalk phenomenon can be reduced. Because the lining layer 60 reduces the amount of reflected light, a negative effect by a diffused reflection, etc. can be reduced and mitigated.

FIGS. 7A to 7D are representations of examples of longitudinal cross-sectional views to assist in the explanation of a method for manufacturing an image sensor in accordance with an embodiment of the disclosed technology.

Figure 7A:
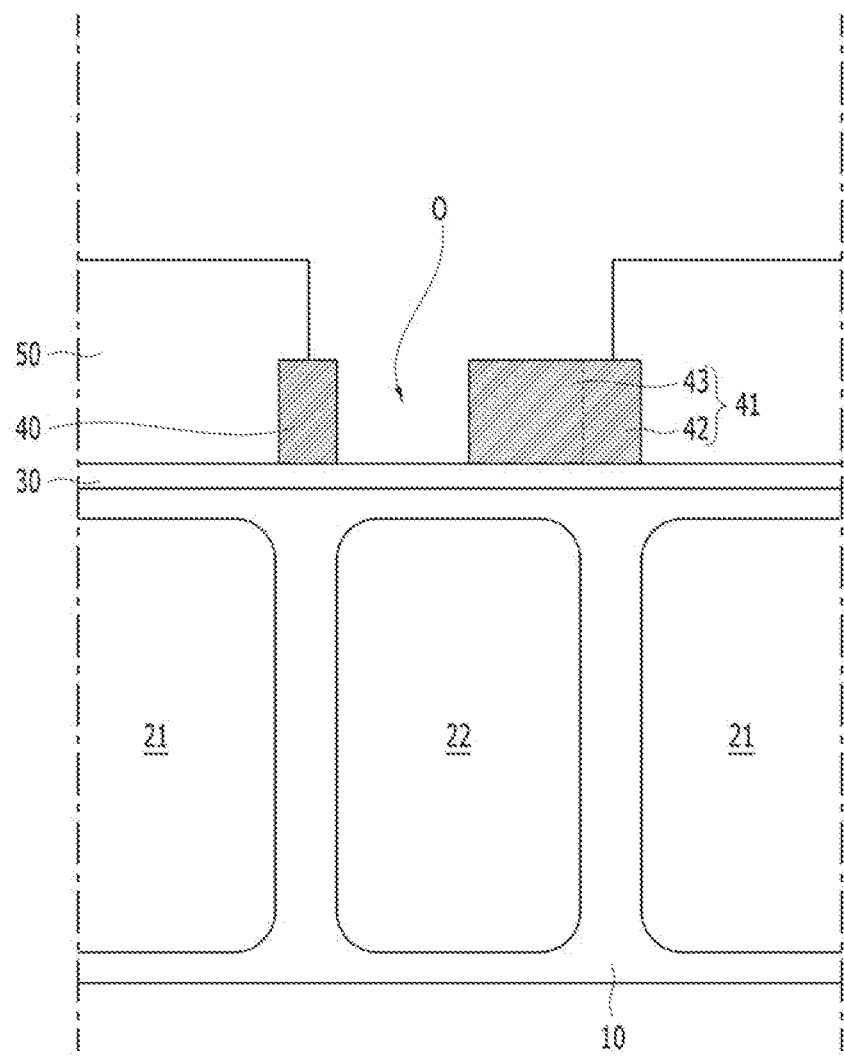
FIGS. 7A to 7D, 8 to 10 and 11A to 11D are representations of examples of longitudinal cross-sectional views to assist in the explanation of methods for manufacturing an image sensor in accordance with embodiments of the disclosed technology.

Referring to FIG. 7A, the method for manufacturing an image sensor in accordance with the embodiment of the disclosed technology may include forming photodiodes 21 and 22 in a substrate 10, forming an antireflection layer 30 on the substrate 10, forming grid patterns 40 and a guide pattern 41 on the antireflection layer 30, and forming color filters 50.

The forming of the photodiodes 21 and 22 may include implanting an impurity ion such as phosphorous (P), arsenic (As) or boron (B), in the substrate 10.

The forming of the antireflection layer 30 may include forming, on the substrate, 10, a silicon nitride (SiN) layer, a silicon oxide (SiO$_2$) layer, a silicon oxynitride (SION) layer, a hydrogen and/or carbon containing silicon oxide (SiOH and/or SiOC) layer, or a dielectric material or a combination thereof, as a single layer or a multi-layer, by performing a deposition process. In another embodiment, the forming of the antireflection layer 30 may include forming trenches in the spaces between the photodiodes 21 and 22 and filling an antireflection material in the trenches.

The forming of the grid patterns 40 and the guide pattern 41 may include forming a grid material layer on the antireflection layer 30 by performing a deposition process, and then performing a photolithography process and an etching process. The guide pattern 41 may include a grid part 42 as a portion of the grid patterns 40 and a guide part 43 which extends from the grid part 42. In some implementations, the grid part 42 may have a same form as the grid patterns 40. A boundary between the grid part 42 and the guide part 43 is indicated by the dotted line. The grid material layer may include a metal such as tungsten (W) or an opaque material.

The forming of the color filters 50 may include filling a color filter material in the spaces which are formed by the grid patterns 40 and the guide pattern 41, and baking the color filter material. The color filter material may include one of a red pigment, a green pigment, or a blue pigment, and a thermosetting polymeric organic material.

An opening O which is defined by the grid pattern 40 and the guide part 43 of the guide pattern 41 may be formed. The opening O may partially expose the top surface of the antireflection layer 30.

Figure 7B:
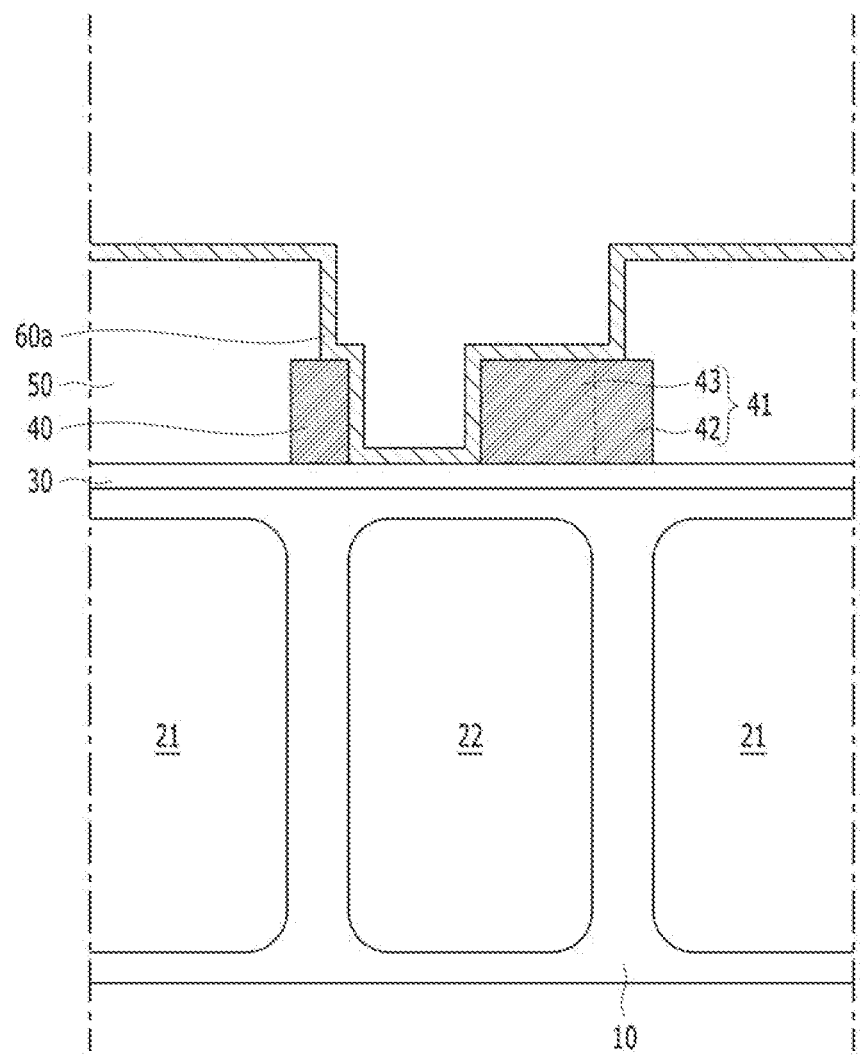

Referring to FIG. 7B, the method may further include conformally forming a lining material layer 60a on an entire surface by performing a deposition process, a coating process, and/or a baking process. The lining material layer 60a may be conformally formed on the exposed top surfaces and side surfaces of the color filters 50, the exposed top surfaces and side surfaces of the grid patterns 40 and the guide pattern 41 and the exposed top surface of the antireflection layer 30. The lining material layer 60a may include a polymeric material such as a polystyrene-based resin, a polyimide-based resin, a polysiloxane-based resin, an acrylic-based resin, or an epoxy-based resin, or a copolymer resin thereof, or a silicon oxide-based or silicon nitride-based inorganic material.

Figure 7C:
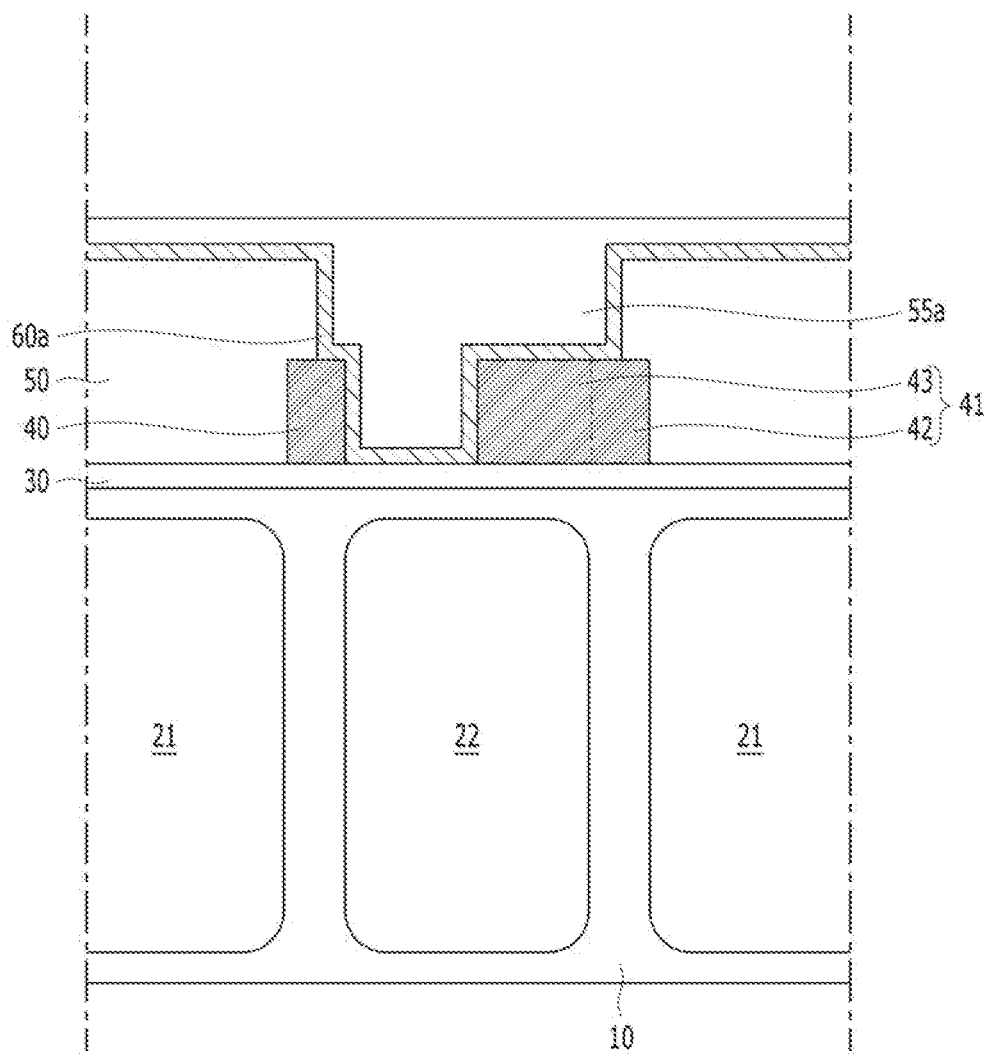

Referring to FIG. 7C, the method may further include forming a phase difference detection filter material layer 55a on the lining material layer 60a by performing a deposition process, a coating process, and/or a baking process. The phase difference detection filter material layer 55a may include a polymeric material such as a polystyrene-based resin, a polyimide-based resin, a polysiloxane-based resin, an acrylic-based resin, or an epoxy-based resin, or a copolymer resin thereof, or a silicon oxide-based or silicon nitride-based inorganic material.

Figure 7D:
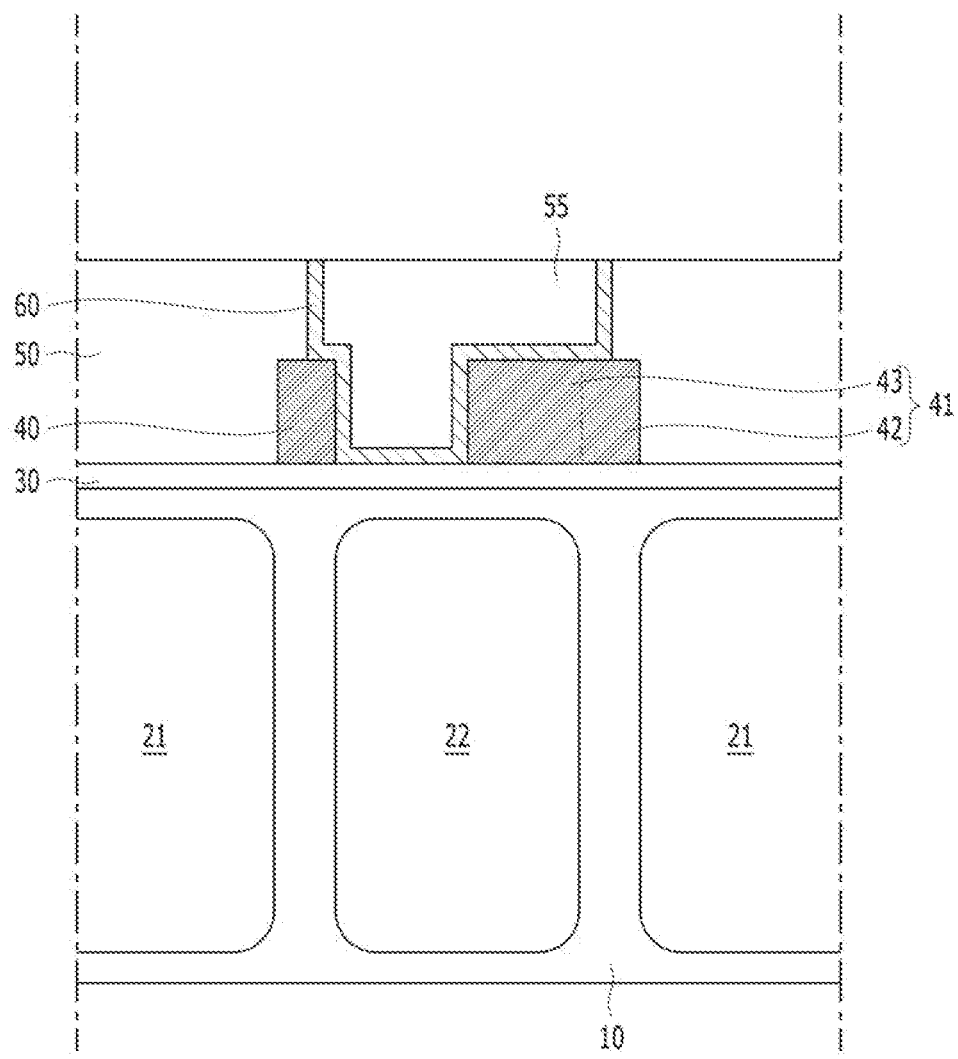

Referring to FIG. 7D, the method may further include planarizing the top surfaces of the color filters 50, the phase difference detection filter material layer 55a and the lining material layer 60a by performing a planarizing process such as etch-back or CMP (chemical mechanical polishing). The top surfaces of the color filters 50, a phase difference detection filter 55 and a lining layer 60 may be coplanar. Thereafter, the method may further include forming an overcoat layer 70 and micro lenses 80 on the color filters 50, the phase difference detection filter 55 and the lining layer 60 which are coplanar, by performing a coating process and a baking process referring to FIG. 4A. The forming the overcoat layer 70 and the micro lenses 80 may include performing a deposition process, a coating process, a reflow process, and/or a baking process. The overcoat layer 70 and the micro lenses 80 may include a polymeric material such as a polystyrene-based resin, a polyimide-based resin, a polysiloxane-based resin, an acrylic-based resin, or an epoxy-based resin, or a copolymer resin thereof, or a silicon oxide-based or silicon nitride-based inorganic material.

Figure 8:
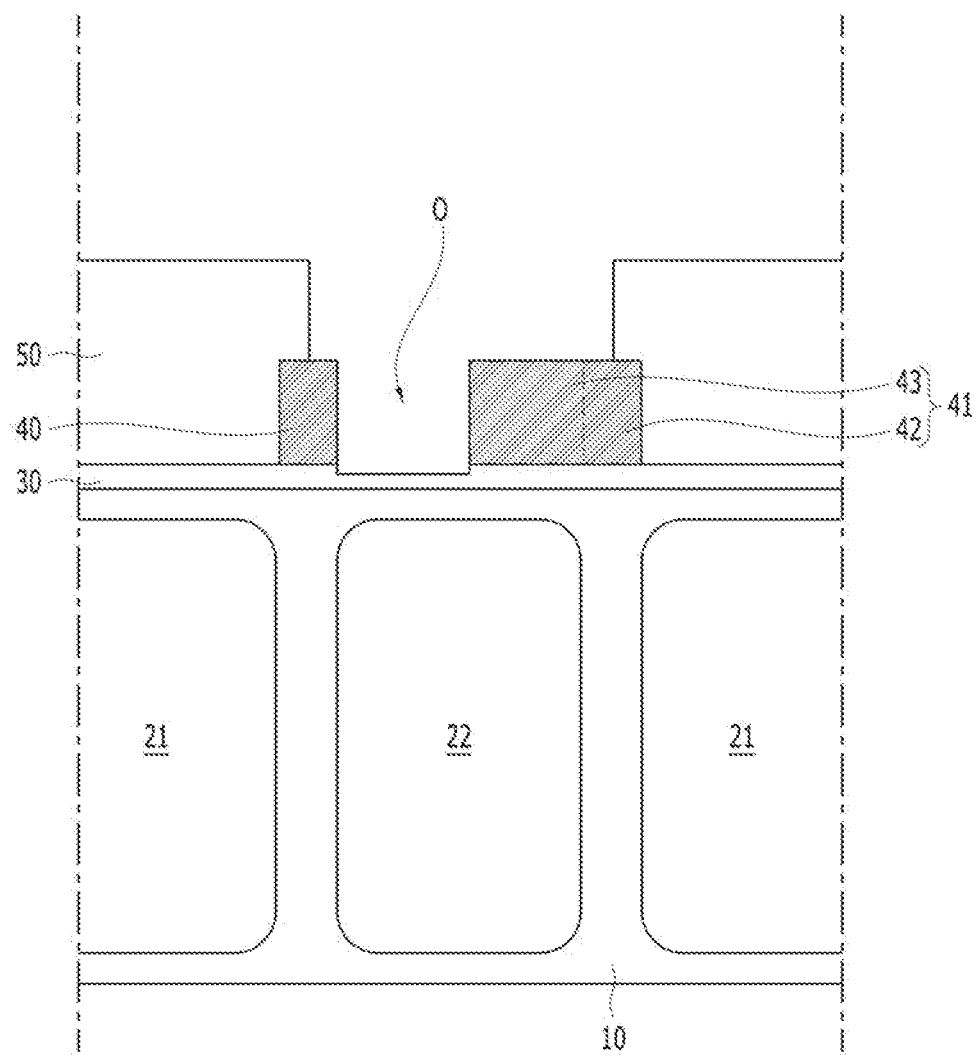
Figure 9:
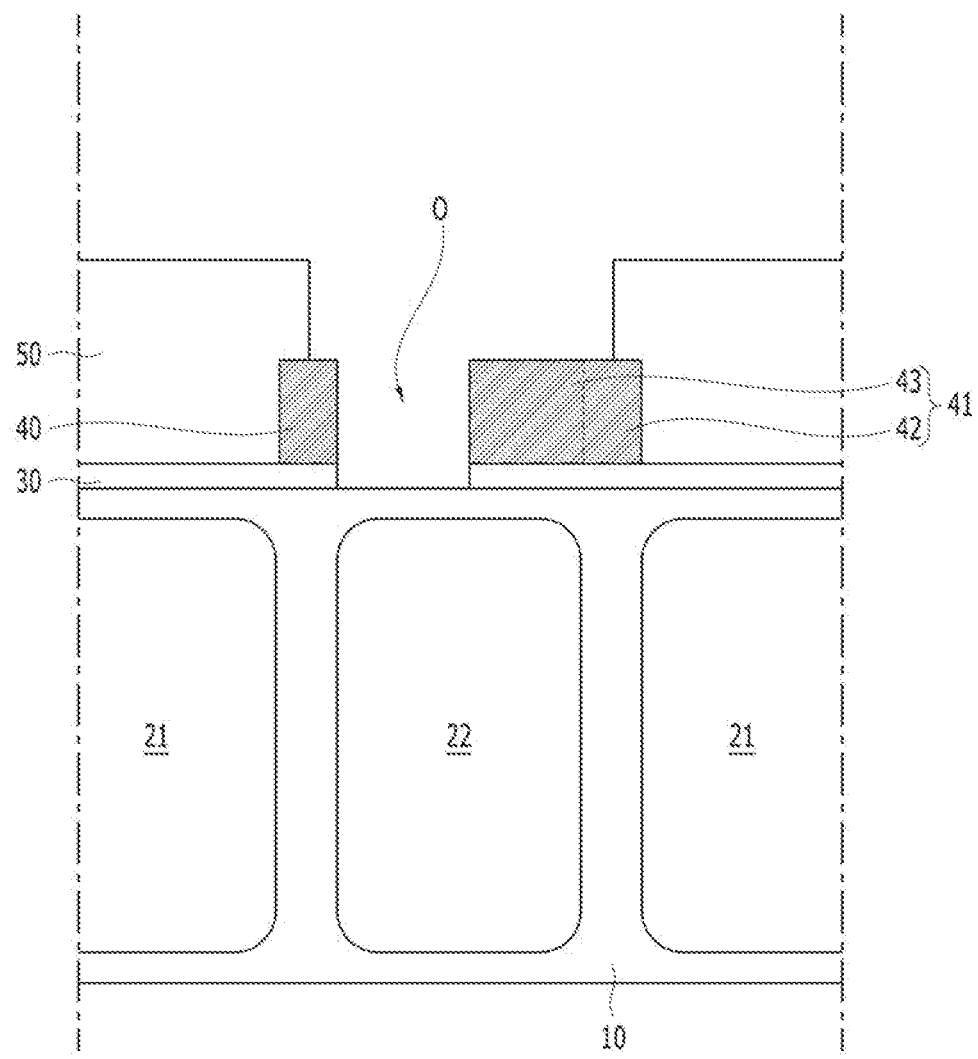
Figure 10:
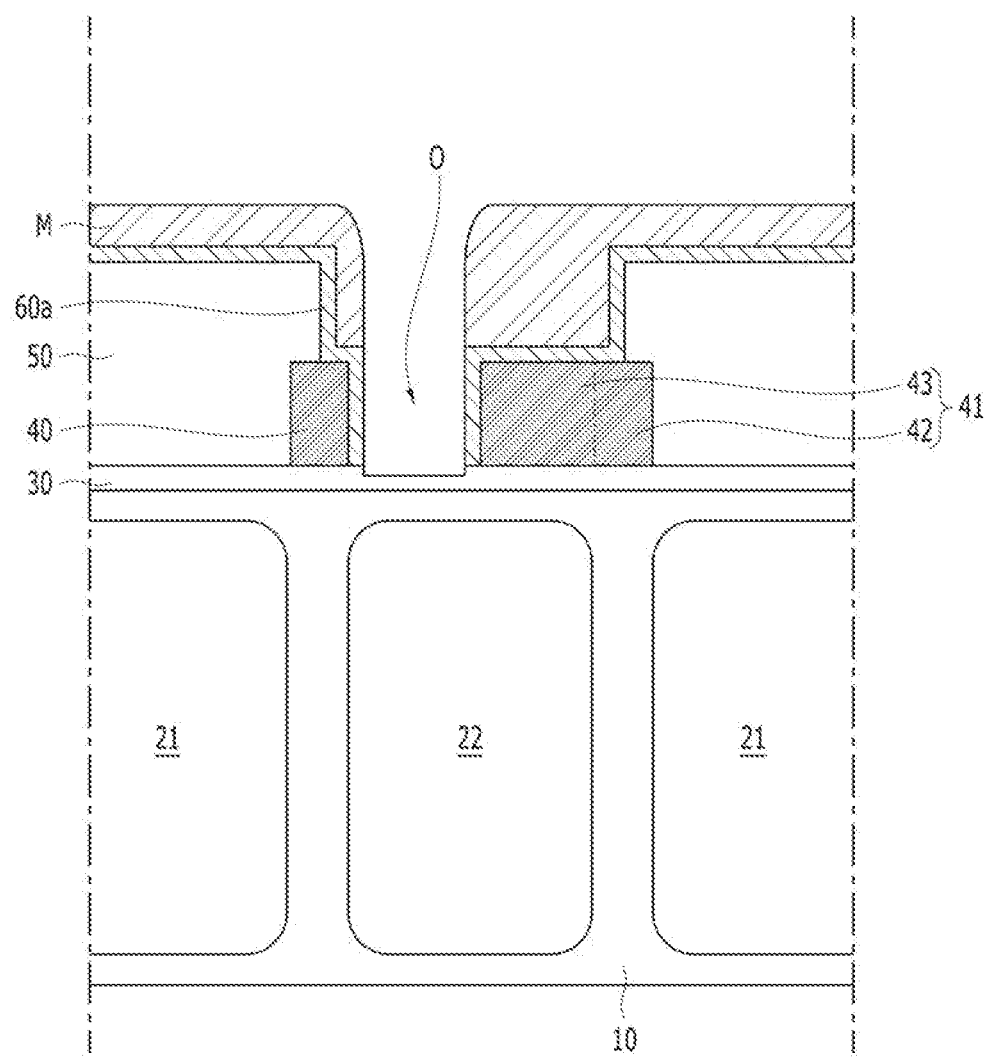

FIGS. 8 to 10 are representations of examples of longitudinal cross-sectional views to assist in the explanation of methods for manufacturing an image sensor in accordance with embodiments of the disclosed technology.

Referring to FIG. 8, a method for manufacturing an image sensor in accordance with an embodiment of the disclosed technology may include forming photodiodes 21 and 22 in a substrate 10, forming an antireflection layer 30 on the substrate 10, forming grid patterns 40 and a guide pattern 41 on the antireflection layer 30 and forming color filters 50, through performing the processes described above with reference to FIG. 7A, and partially removing and recessing the antireflection layer 30 which is exposed in the opening O, by additionally performing an etch-back process. Thereafter, the method may further include forming a lining layer 60 and a phase difference detection filter 55 by performing the processes described above with reference to FIGS. 7B to 7D, and forming an overcoat layer 70 and micro lenses 80 by referring to FIG. 4B.

Referring to FIG. 9, a method for manufacturing an image sensor in accordance with an embodiment of the disclosed technology may include forming photodiodes 21 and 22 in a substrate 10, forming an antireflection layer 30 on the substrate 10, forming grid patterns 40 and a guide pattern 41 on the antireflection layer 30 and forming color filters 50, through performing the processes described above with reference to FIG. 7A, and removing the antireflection layer 30 which is exposed in the opening O and thereby exposing the top surface of the substrate 10, by additionally performing an etch-back process. Thereafter, the method may further include forming a lining layer 60 and a phase difference detection filter 55 by performing the processes described above with reference to FIGS. 7B to 7D, and forming an overcoat layer 70 and micro lenses 80 by referring to FIG. 4C.

Referring to FIG. 10, a method for manufacturing an image sensor in accordance with an embodiment of the disclosed technology may include forming photodiodes 21 and 22 in a substrate 10, forming an antireflection layer 30 on the substrate 10, forming grid patterns 40 and a guide pattern 41 on the antireflection layer 30 and forming color filters 50, through performing the processes described above with reference to FIGS. 7A and 8, partially removing and recessing the antireflection layer 30 which is exposed in the opening O, by additionally performing an etch-back process, conformally forming a lining material layer 60a on the surface of the recessed antireflection layer 30, the side surfaces and top surfaces of the grid patterns 40 and the guide pattern 41 and the side surfaces and top surfaces of the color filters 50, forming a mask pattern M which exposes the bottom of the opening O, and removing the lining material layer 60a at the bottom of the opening O by performing an etching process. In this procedure, the antireflection layer 30 which is exposed at the bottom of the opening O may be partially removed and recessed. Thereafter, the mask pattern M may be removed.

Then, the method may further include forming a lining layer 60 and a phase difference detection filter 55 by performing the processes described above with reference to FIGS. 7C and 7D, and forming an overcoat layer 70 and micro lenses 80 by referring to FIG. 4D.

FIGS. 11A to 11D are representations of examples of longitudinal cross-sectional views to assist in the explanation of methods for manufacturing an image sensor in accordance with embodiments of disclosed technology.

Figure 11A:
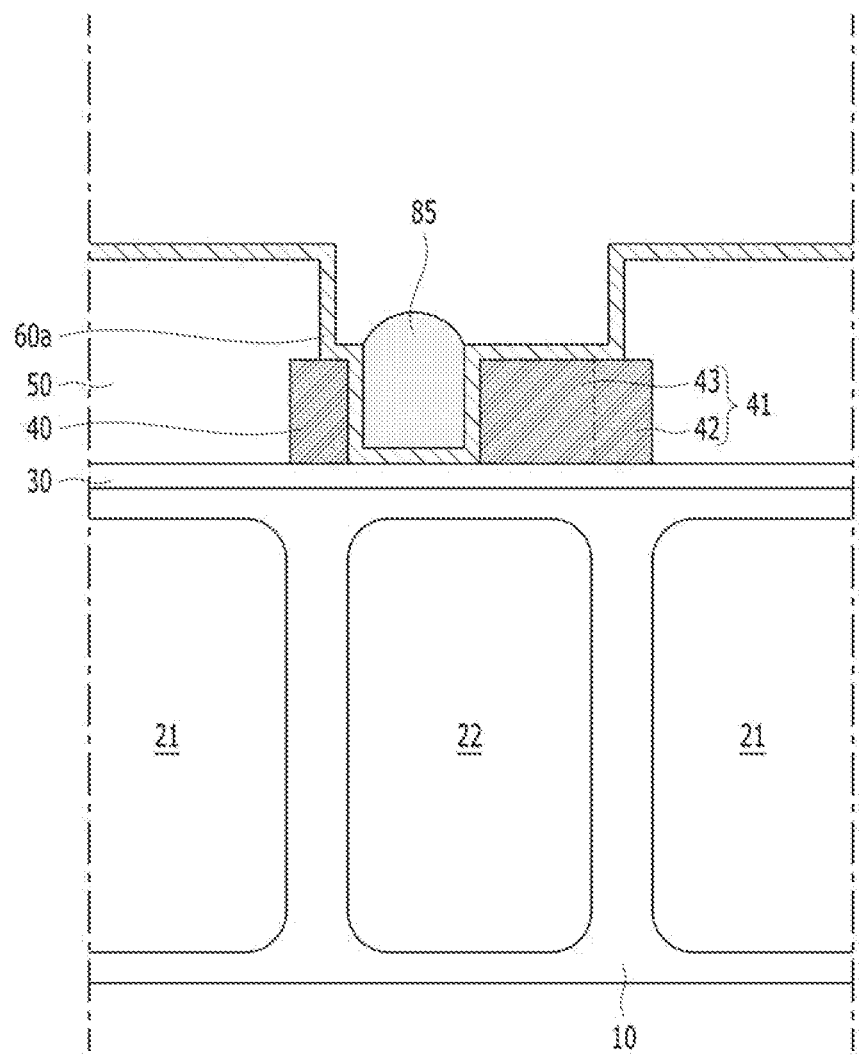

Referring to FIG. 11A, a method for manufacturing an image sensor in accordance with an embodiment of the present disclosure may include, forming, after performing the processes described above with reference to FIGS. 7A and 7B, an internal lens 85 which fills the opening O, on the lining material layer 60a, by performing a deposition process, a coating process, a squeezing process, a reflow process and/or a baking process. The internal lens 85 may include a polymeric material such as a polystyrene-based resin, a polyimide-based resin, a polysiloxane-based resin, an acrylic-based resin, or an epoxy-based resin or a copolymer resin thereof, or a silicon oxide-based or silicon nitride-based inorganic material. Then, the method may include performing the processes described above with reference to FIGS. 7C and 7D, and forming an overcoat layer 70 and micro lenses 80 by referring to FIG. 5A.

Figure 11B:
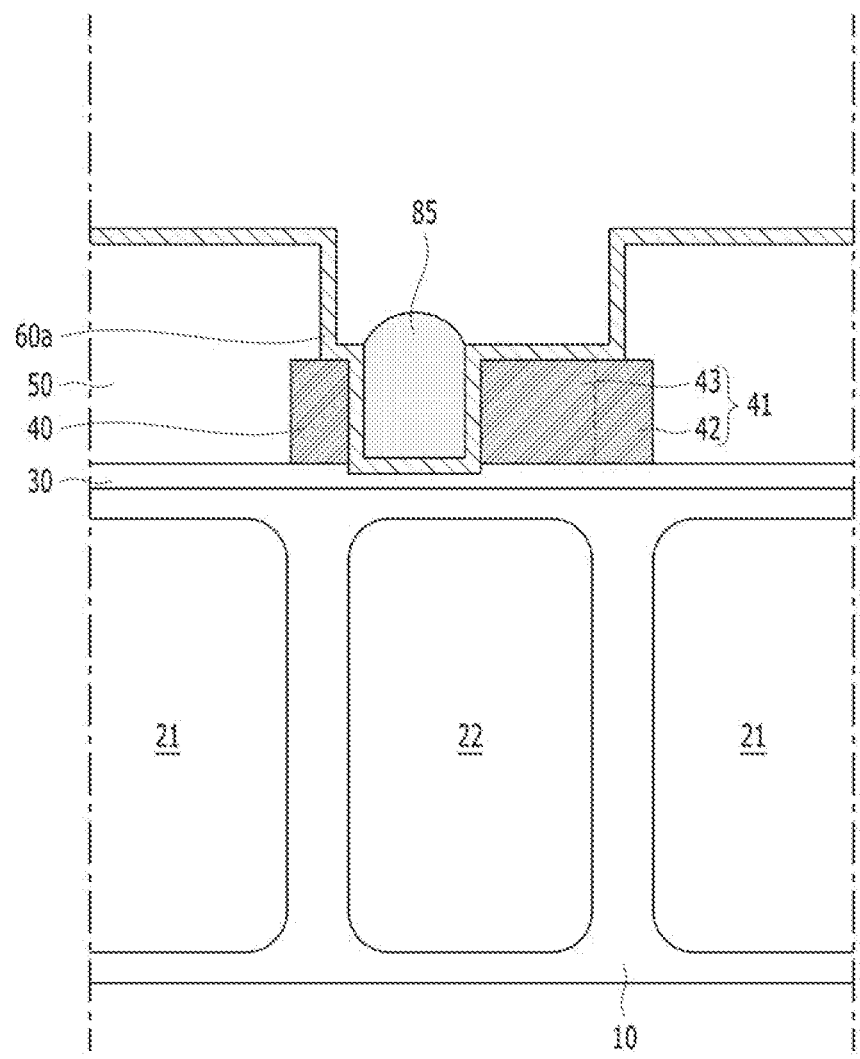

Referring to FIG. 11B, a method for manufacturing an image sensor in accordance with an embodiment of the disclosed technology may include, forming, on the lining material layer 60a, an internal lens 85 which fills the opening O, after performing the processes described above with reference to FIGS. 7A and 8.

Figure 11C:
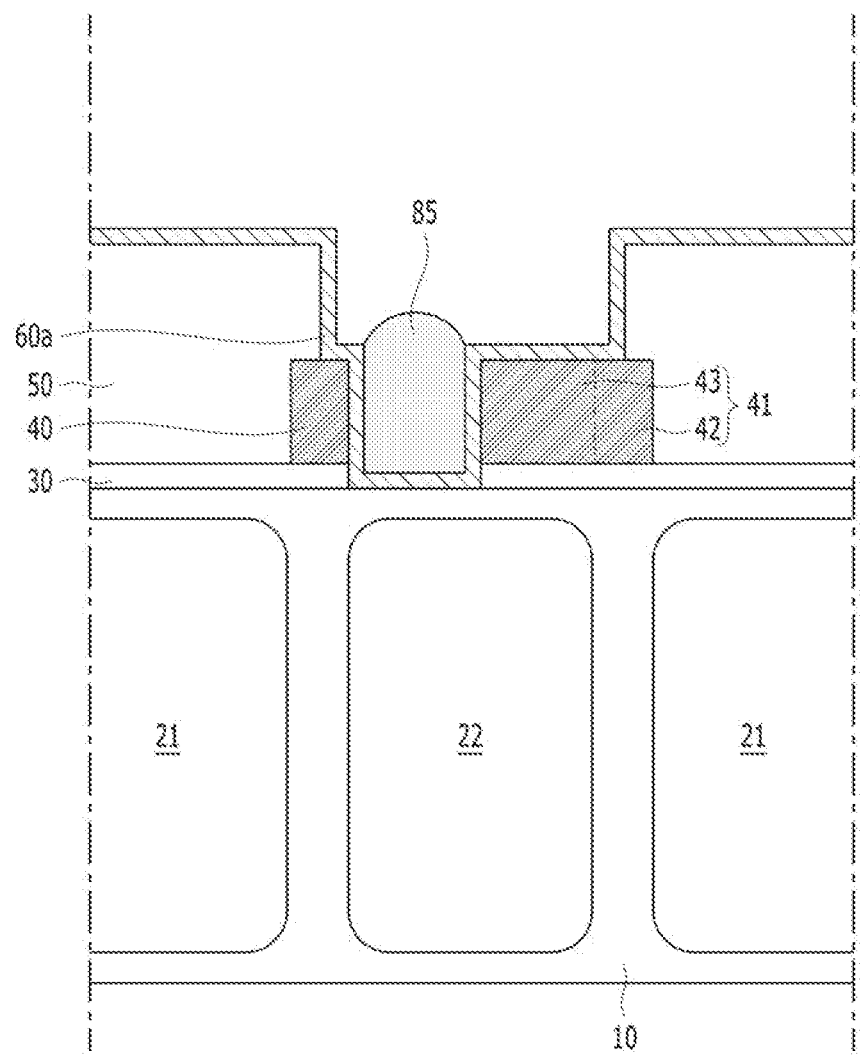

Referring to FIG. 11C, a method for manufacturing an image sensor in accordance with an embodiment of the disclosed technology may include, forming, on the lining material layer 60a, an internal lens 85 which fills the opening O, after performing the processes described above with reference to FIGS. 7A and 9.

Figure 11D:
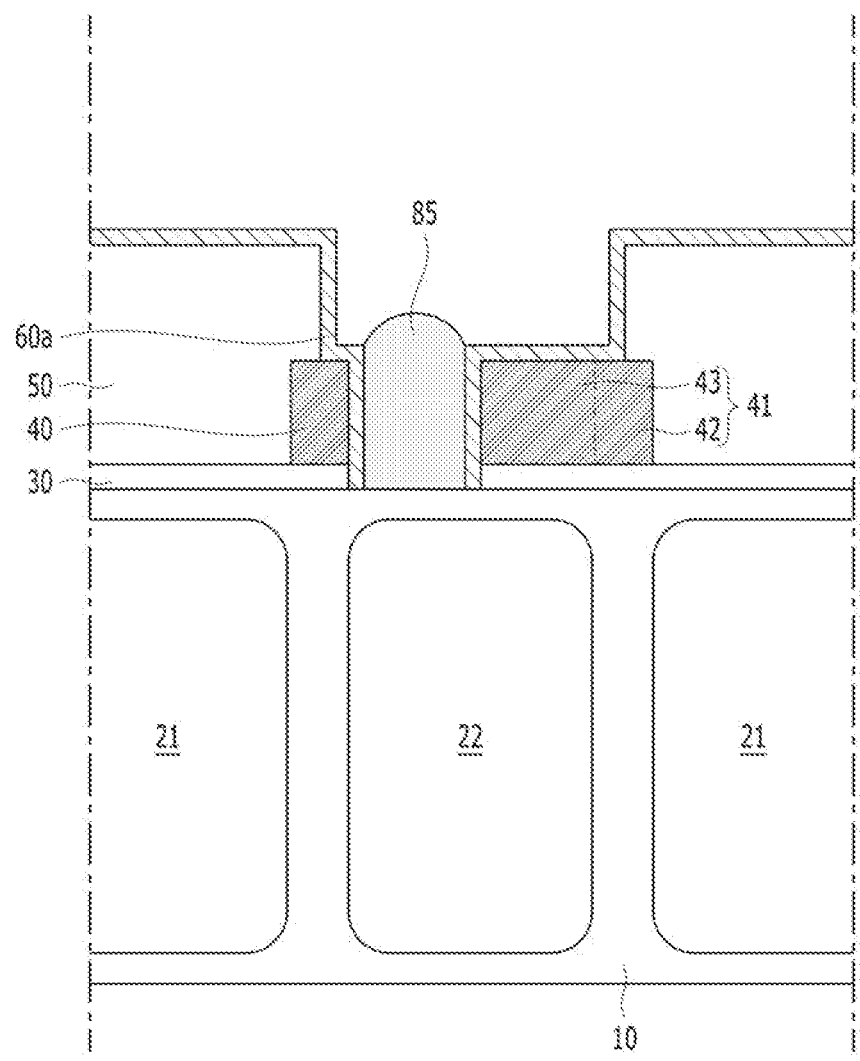

Referring to FIG. 11D, a method for manufacturing an image sensor in accordance with an embodiment of the disclosed technology may include, forming, on the lining material layer 60a, an internal lens 85 which fills the opening O, after performing the processes described above with reference to FIGS. 7A, 8 and 10.

Figure 12:
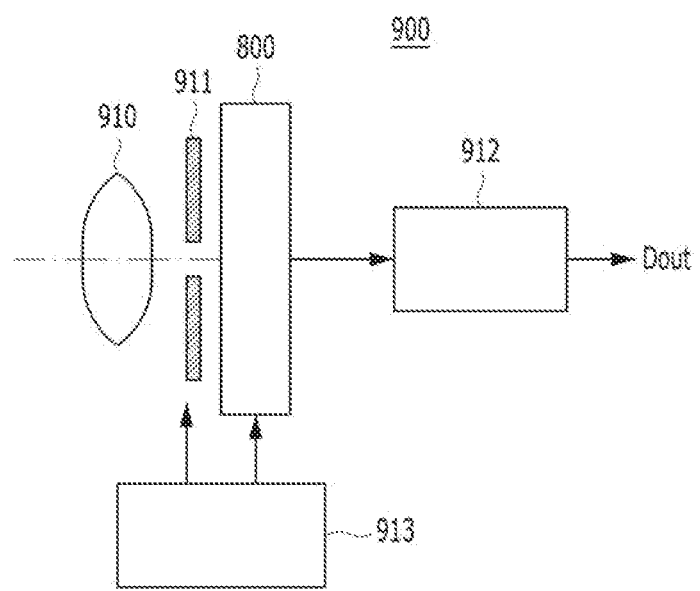
FIG. 12 is a diagram schematically illustrating a representation of an example of an electronic device including an image sensor in accordance with an embodiment of the disclosed technology.

FIG. 12 is a diagram schematically illustrating a representation of an example of an electronic device including the image sensor based on an embodiment of the disclosed technology.

Referring to FIG. 12, the electronic device including the image sensor based on the embodiment of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to a pixel array (see the reference numeral 100 of FIG. 16) of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

While this patent document contains many specifics, these should not be construed as limitations on the scope of any implementation or of what may be claimed, but rather as descriptions of features that may be specific to particular embodiments of the disclosed technology. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An image sensor comprising:
   a substrate;
   an image photo sensor formed in the substrate to receive incident light and to produce an image signal representing a received portion of the incident light for forming an image;
   a phase difference detection photo sensor formed in the substrate to receive a portion of the incident light to convert the received light into a phase difference detection signal representing a phase of the image;

an antireflection layer formed over the substrate to reduce optical reflection of the incident light received by the image photo sensor and the phase difference detection photo sensor;

a grid pattern and a guide pattern formed over the antireflection layer;

a color filter formed over the antireflection layer and the image photo sensor to transmit light in the incident light at a selected color to reach the image photo sensor for producing the image signal;

a phase difference detection filter formed over the antireflection layer and the phase difference detection photo sensor to transmit light in the incident light at a selected color to reach the phase difference detection photo sensor for producing the phase difference detection signal;

a lining layer formed of a transparent layer having a refractive index lower than a refractive index of the phase difference detection filter and located to transmit light filtered by the phase difference detection filter, the lining layer structured to include a portion located between the color filter and the phase difference detection filter; and an internal lens located between the grid pattern and a guide part of the guide pattern to direct light into the phase difference detection photo sensor.

2. The image sensor according to claim 1,
wherein the lining layer includes a portion that is disposed between the grid pattern and the phase difference detection filter, and a portion that is disposed between the guide pattern and the phase difference detection filter.

3. The image sensor according to claim 2,
wherein the lining layer includes a portion that is formed between the antireflection layer and the phase difference detection filter.

4. The image sensor according to claim 1,
wherein the guide pattern comprises a grid part which is disposed over a space between the image photo sensor and the phase difference detection photo sensor, and the guide part which partially covers the phase difference detection photo sensor.

5. The image sensor according to claim 1,
wherein the lining layer has a refractive index lower than that of the color filter.

6. The image sensor according to claim 1,
wherein a top surface of the antireflection layer which is in contact with the lining layer is recessed.

7. The image sensor according to claim 1,
wherein the lining layer surrounds side surfaces of the phase difference detection filter.

8. The image sensor according to claim 7,
wherein the lining layer surrounds side surfaces and a bottom surface of the phase difference detection filter.

9. The image sensor according to claim 1,
wherein top surfaces of the color filter, the phase difference detection filter and the lining layer are coplanar.

10. An image sensor comprising:
an antireflection layer formed over a substrate;
grid patterns and a guide pattern that are disposed over the antireflection layer;
a color filter between the grid patterns;
a phase difference detection filter structured to include a portion between one of the grid patterns and the guide pattern; and a lining layer formed to include a portion between one of the grid patterns and the phase difference detection filter and an internal lens located between the grid patterns and the guide pattern to direct light into a phase difference detection photo sensor that is disposed under the antireflection layer and configured to produce a phase difference detection signal, wherein the lining layer has a refractive index lower than that of the phase difference detection filter.

11. The image sensor according to claim 10,
wherein the lining layer includes a portion that is formed between the color filter and the phase difference detection filter.

12. The image sensor according to claim 10,
wherein the lining layer includes a portion that is formed between the guide pattern and the phase difference detection filter.

13. The image sensor according to claim 10,
wherein the lining layer includes a portion that is formed between the antireflection layer and the phase difference detection filter.

14. The image sensor according to claim 10, further comprising:
an overcoat layer and micro lenses that are formed over top surfaces of the color filter, the phase difference detection filter and the lining layer,
wherein the top surfaces of the color filter, the phase difference detection filter, and the lining layer are coplanar.

15. The image sensor according to claim 10,
wherein the lining layer comprises a polymeric organic material.

16. An image sensor comprising:
a substrate including an image photodiode to receive incident light and to produce an image signal representing a received portion of the incident light for forming an image and a phase difference detection photodiode to receive a portion of the incident light to convert the received light into a phase difference detection signal representing a phase of the image;
an antireflection layer disposed over the substrate;
a color filter disposed over the antireflection layer and overlapping with the image photodiode to filter light that is incident to the image photodiode;
a phase difference detection filter disposed over the antireflection layer and overlapping with the phase difference detection photodiode to filter light that is incident to the phase difference detection photodiode to filter light that is incident to the image; and
a lining layer formed in contact with the phase difference detection filter to include a portion between the color filter and the phase difference detection filter
a grid pattern disposed between the color filter and the phase difference detection filter and over the antireflection layer; and
an internal lens located adjacent the grid pattern and configured to direct light into the phase difference detection photodiode,
wherein the lining layer has a refractive index lower than a refractive index of the phase difference detection filter and a refractive index of the color filter.

17. The image sensor according to claim 16,
wherein the lining layer include a portion that is between the grid pattern and the phase difference detection filter.

18. The image sensor according to claim 16, further comprising:

a guide pattern disposed over the antireflection layer and between the color filter and the phase difference detection filter, wherein the guide pattern comprises a grid part and a guide part which extends from the grid part and covers a portion of the phase difference detection photodiode, and wherein the lining layer includes a portion that is between the guide pattern and the phase difference detection filter.

19. The image sensor according to claim 16, wherein the lining layer includes a portion that is between the antireflection layer and the phase difference detection filter.

20. An image sensor comprising:

an antireflection layer formed over a substrate;

grid patterns and a guide pattern that are disposed over the antireflection layer;

a color filter between the grid patterns;

a phase difference detection filter structured to include a portion between one of the grid patterns and the guide pattern; and a lining layer formed to include a portion between one of the grid patterns and the phase difference detection filter, wherein the lining layer has a refractive index lower than that of the phase difference detection filter, and wherein a top surface of the antireflection layer has a recessed portion which is in contact with the lining layer.

21. The image sensor according to claim 20, wherein the lining layer is in contact with a surface of the substrate in the recessed portion without having the antireflection layer between substrate and the lining layer.

\* \* \* \* \*